US012641771B2

(12) United States Patent
Kim et al.

(10) Patent No.: US 12,641,771 B2
(45) Date of Patent: May 26, 2026

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Beom Seo Kim, Suwon-si (KR); Bo Ram Gu, Namyangju-si (KR); Ja Min Koo, Hwaseong-si (KR); Sung Gil Kim, Yongin-si (KR); Jong Hyeok Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 731 days.

(21) Appl. No.: 17/933,363

(22) Filed: Sep. 19, 2022

(65) Prior Publication Data

US 2023/0180458 A1 Jun. 8, 2023

(30) Foreign Application Priority Data

Dec. 7, 2021 (KR) ........................ 10-2021-0174084

(51) Int. Cl.
H10B 12/00 (2023.01)
G11C 5/06 (2006.01)

(52) U.S. Cl.
CPC ........... H10B 12/315 (2023.02); G11C 5/063 (2013.01); H10B 12/31 (2023.02); H10B 12/34 (2023.02);
(Continued)

(58) Field of Classification Search
CPC ...... H10B 12/31; H10B 12/315; H10B 12/34; H10B 12/482; H10B 12/485; G11C 5/063
See application file for complete search history.

(56) References Cited

U.S. PATENT DOCUMENTS 5,945,707 A * 8/1999 Bronner ............... H10B 12/053
257/E21.651
8,580,669 B2 11/2013 Kim
(Continued)

FOREIGN PATENT DOCUMENTS

CN 108172620 A * 6/2018 ........... H10D 30/024
JP 2013098255 5/2013
(Continued)

OTHER PUBLICATIONS

Office Action dated Jul. 10, 2025 issued in the corresponding Korean Patent Application No. 10-2021-0174084. (Note: JP 2013-098255 A already submitted.).

*Primary Examiner* — Matthew E Warren
(74) *Attorney, Agent, or Firm* — MORGAN, LEWIS & BOCKIUS LLP

(57) ABSTRACT

A semiconductor memory device includes a substrate including an active area defined by an element separation layer, the active area including a first portion and second portions defined on both sides of the first portion a bit line crossing the active area and extending in a first direction on the substrate, and a bit line contact disposed between the substrate and the bit line and directly connected to the first portion of the active area. The bit line contact includes an indent area recessed into the substrate and an upper area on the indent area, a width of the indent area decreases as a distance from the bit line increases, the indent area includes a slope forming a boundary with the substrate and having a straight line shape, and a starting point of the slope of the indent area is lower than an upper surface of the element separation layer.

15 Claims, 32 Drawing Sheets

(52) U.S. Cl.
 CPC ......... *H10B 12/482* (2023.02); *H10B 12/485*
 (2023.02)

(56) References Cited

U.S. PATENT DOCUMENTS

| | | | | | |
|---|---|---|---|---|---|
| 8,906,763 | B2 | 12/2014 | Park et al. | | |
| 9,287,163 | B2 | 3/2016 | Kim | | |
| 9,337,089 | B2 | 5/2016 | Cho | | |
| 9,362,422 | B2 | 6/2016 | Lim | | |
| 10,665,592 | B2 | 5/2020 | Song et al. | | |
| 2006/0160286 | A1 | 7/2006 | Hwang et al. | | |
| 2008/0151592 | A1 | 6/2008 | Baars et al. | | |
| 2012/0025283 | A1* | 2/2012 | Son | ................... | H01L 21/76805 |
| | | | | | 257/296 |
| 2014/0117492 | A1 | 5/2014 | Kim et al. | | |
| 2019/0386009 | A1* | 12/2019 | Kim | ..................... | H10B 12/482 |
| 2021/0035613 | A1 | 2/2021 | Park et al. | | |
| 2023/0008414 | A1* | 1/2023 | Pan | ........................ | H10B 12/34 |
| 2023/0017800 | A1* | 1/2023 | Sung | ................. | H10B 12/0335 |
| 2023/0079234 | A1* | 3/2023 | Wang | ............... | H01L 21/67075 |
| | | | | | 257/209 |
| 2023/0112907 | A1* | 4/2023 | Kim | ................... | H10B 12/0335 |
| | | | | | 257/296 |

FOREIGN PATENT DOCUMENTS

| | | | |
|---|---|---|---|
| KR | 10-2012-0011431 | A | 2/2012 |
| KR | 10-2014-0052729 | A | 5/2014 |
| KR | 10-2021-0013799 | A | 2/2021 |

* cited by examiner

SEMICONDUCTOR MEMORY DEVICE AND METHOD OF FABRICATING THE SAME

CROSS-REFERENCE TO RELATED APPLICATION

This application claims priority under 35 U.S.C. § 119 to Korean Patent Application No. 10-2021-0174084, filed on Dec. 7, 2021 in the Korean Intellectual Property Office, the disclosure of which is incorporated by reference herein in its entirety.

TECHNICAL FIELD

Embodiments of the present disclosure relate to a semiconductor memory device and a method of fabricating the same, and more particularly, to a semiconductor memory device having a plurality of wiring lines and node pads intersecting each other, and a method of fabricating the same.

DISCUSSION OF RELATED ART

As semiconductor elements become more highly integrated, individual circuit patterns are becoming more miniaturized to implement more semiconductor elements in the same area. That is, as the degree of integration of semiconductor elements increases, a design rule for the components of the semiconductor element decreases.

SUMMARY

Aspects of the present disclosure provide a semiconductor device capable of increasing reliability and performance.

Aspects of the present disclosure provide a method of fabricating a semiconductor device capable of increasing reliability and performance.

According to an aspect of the present disclosure, there is provided a semiconductor memory device including a substrate including an active area defined by an element separation layer, the active area including a first portion and second portions defined on both sides of the first portion, a bit line crossing the active area and extending in a first direction on the substrate, and a bit line contact disposed between the substrate and the bit line and directly connected to the first portion of the active area. The bit line contact includes an indent area recessed into the substrate and an upper area on the indent area, a width of the indent area of the bit line contact decreases as a distance from the bit line increases, the indent area of the bit line contact includes a slope forming a boundary with the substrate and having a substantially straight line shape, and a starting point of the slope of the indent area is lower than an upper surface of the element separation layer.

According to an aspect of the present disclosure, there is provided a semiconductor memory device including a substrate including an active area defined by an element separation layer, a word line crossing the active area in a first direction, a bit line crossing the active area and extending in a second direction different from the first direction on the substrate, and a bit line contact disposed between word lines adjacent in the second direction and directly connected to the bit line and the active area. The bit line contact includes an indent area recessed into the substrate and an upper area on the indent area, a width of the indent area of the bit line contact decreases as a distance from the bit line increases, the indent area of the bit line contact includes a slope forming a boundary with the substrate and having a substantially straight line shape, and a starting point of the slope of the indent area is lower than an upper surface of the element separation layer.

According to an aspect of the present disclosure, there is provided a semiconductor memory device including a substrate including an active area defined by an element separation layer and extending in a first direction, the active area including a first portion and second portions defined on both sides of the first portion, a word line extending in a second direction different from the first direction and crossing between the first portion of the active area and the second portion of the active area, in the substrate and the element separation layer, a bit line contact connected to the first portion of the active area, a node connection pad connected to the second portion of the active area, a bit line, on the bit line contact, connected to the bit line contact and extending in a third direction different from the first direction and the second direction, and a capacitor connected to the node connection pad. The bit line contact includes an indent area embedded in the substrate and an upper area on the indent area, the substrate includes a boundary surface belonging to a {111} crystal plane group, and the boundary surface of the substrate forms a boundary with the indent area of the bit line contact.

According to an aspect of the present disclosure, there is provided a method of fabricating a semiconductor memory device including providing a substrate including an active area defined by an element separation layer, forming a word line extending in a first direction in the substrate and the element separation layer, the active area being divided into a first portion of the active area and a second portion of the active area by the word line, forming a cell insulating layer including a bit line contact opening on the substrate, the bit line contact opening overlapping the first portion of the active area, forming a first bit line contact recess in the substrate using the cell insulating layer as a mask, etching a portion of the substrate exposed by the first bit line contact recess to form a second bit line contact recess including an indent recess, forming a pre-bit line contact filling the second bit line contact recess, forming a cell conductive layer on the pre-bit line contact and the cell insulating layer, and patterning the cell conductive layer and the pre-bit line contact to form a bit line contact and a bit line extending in a second direction different from the first direction.

BRIEF DESCRIPTION OF THE DRAWINGS

The above and other features of the present disclosure will become more apparent by describing in detail embodiments thereof with reference to the accompanying drawings.

FIG. 8 is a view schematically illustrating a concentration of impurities along a scan line of FIG. 6 according to some embodiments.

FIGS. 20 to 32 are intermediate step views illustrating a method of fabricating a semiconductor memory device according to some embodiments.

DETAILED DESCRIPTION OF THE EMBODIMENTS

Figure 1:
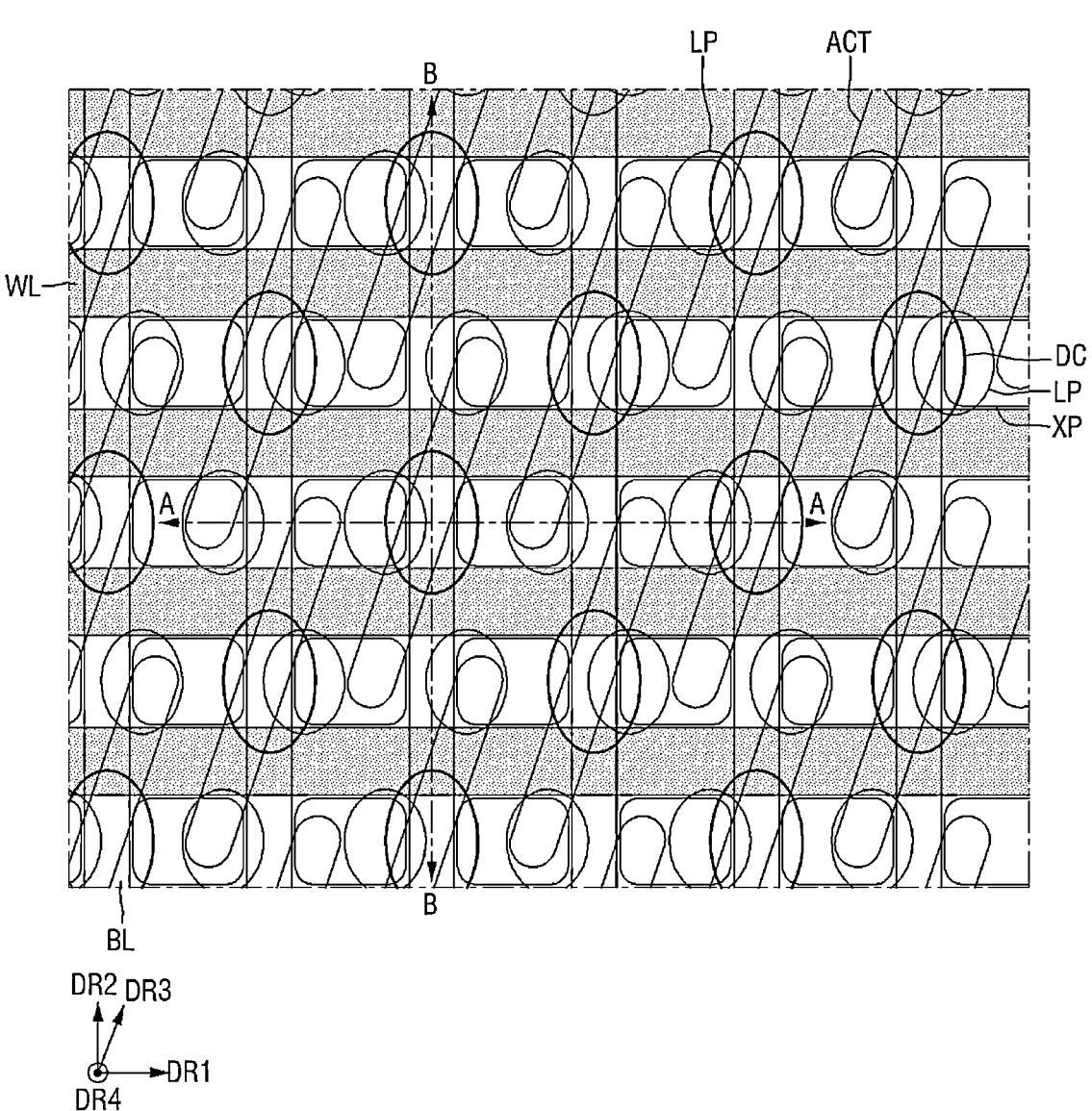
FIG. 1 is a schematic layout of a semiconductor device according to some embodiments.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 2:
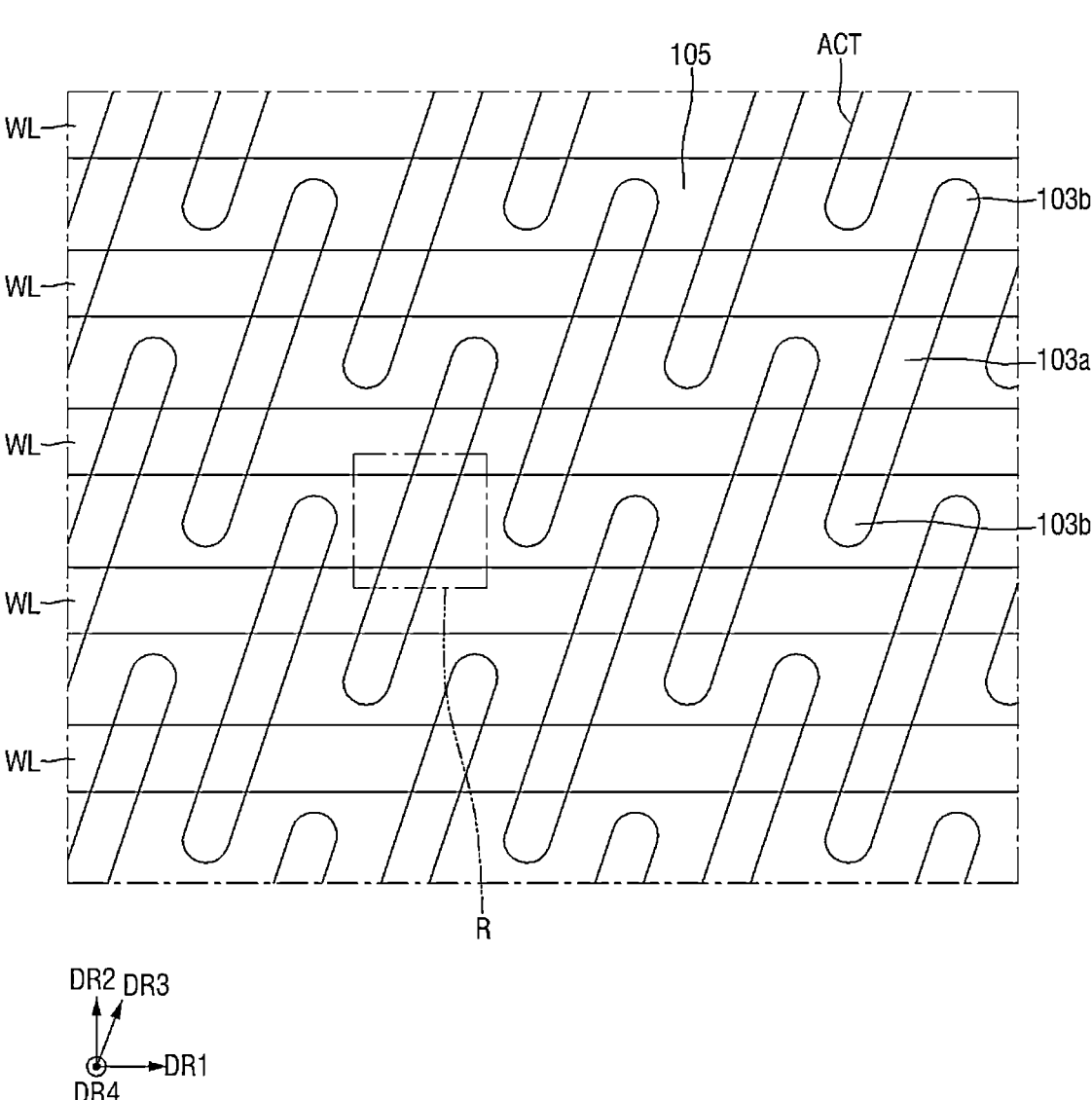
FIG. 2 is a layout illustrating only the word line and active area of FIG. 1 according to some embodiments.
Figure 3:
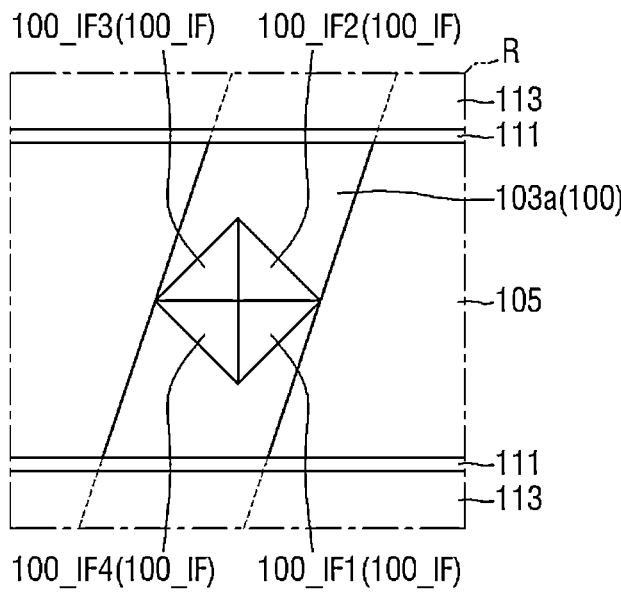
FIG. 3 is a view illustrating a boundary surface of a substrate forming a boundary with a bit line contact in an area R of FIG. 2 according to some embodiments.
Figure 4:
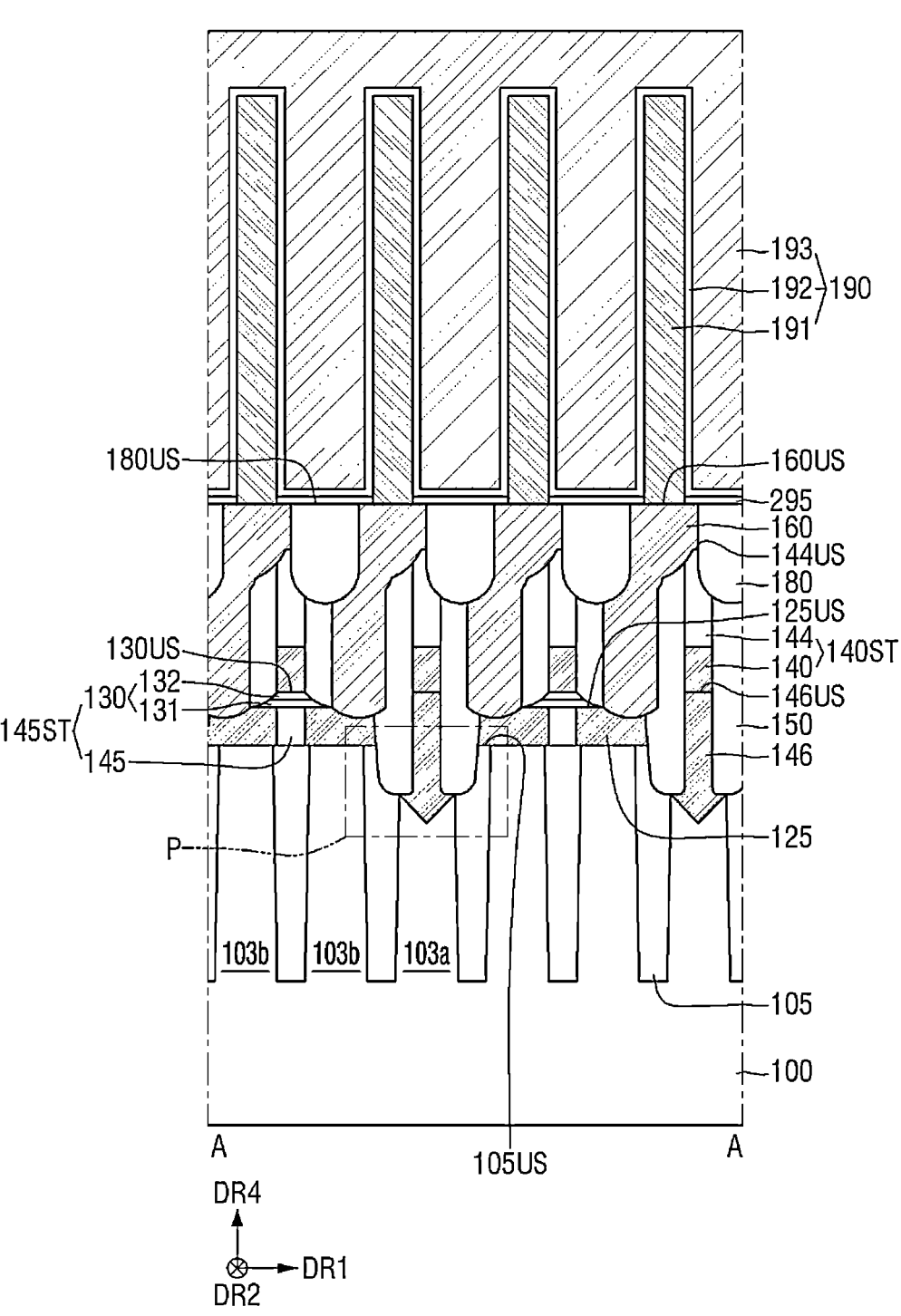
FIG. 4 is an exemplary cross-sectional view taken along line A-A of FIG. 1 according to some embodiments.
Figure 5:
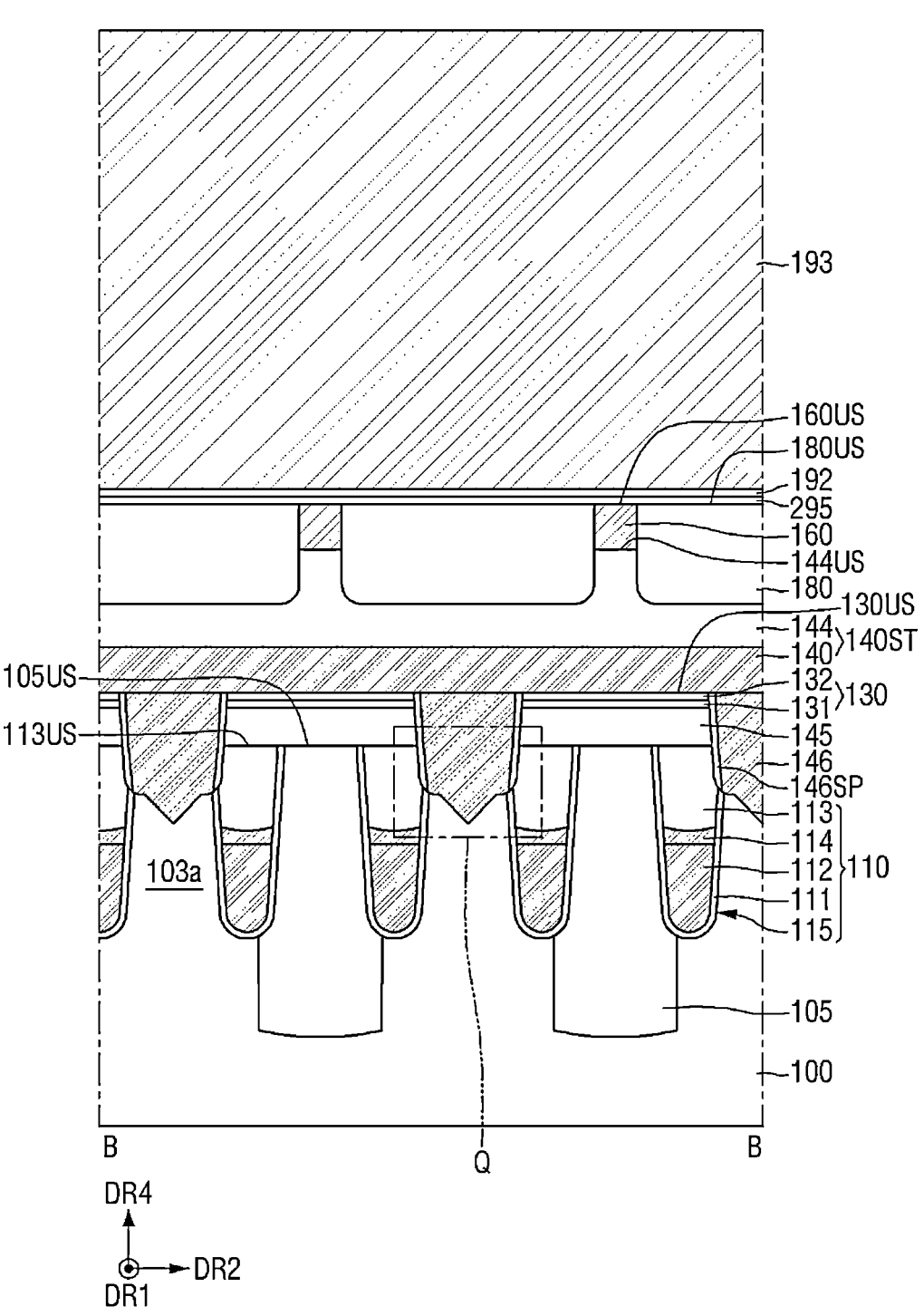
FIG. 5 is an exemplary cross-sectional view taken along line B-B of FIG. 1 according to some embodiments.
Figure 6:
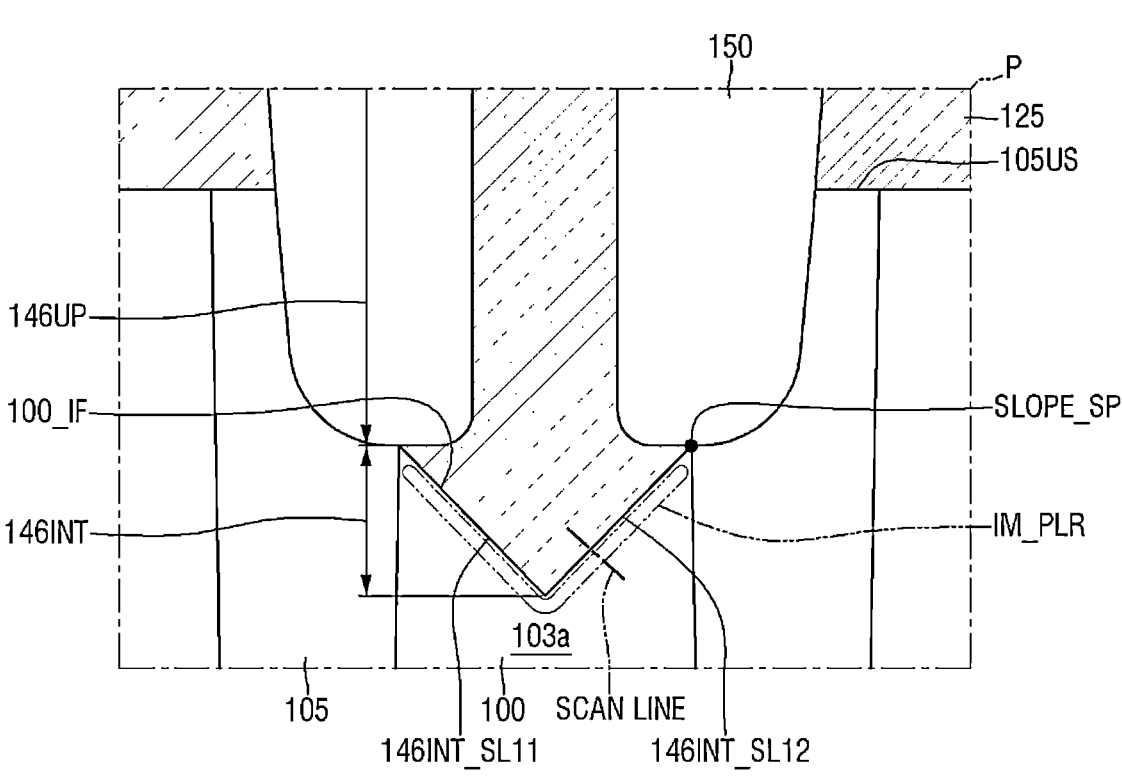
FIG. 6 is an enlarged view of part P of FIG. 4 according to some embodiments.
Figure 7:
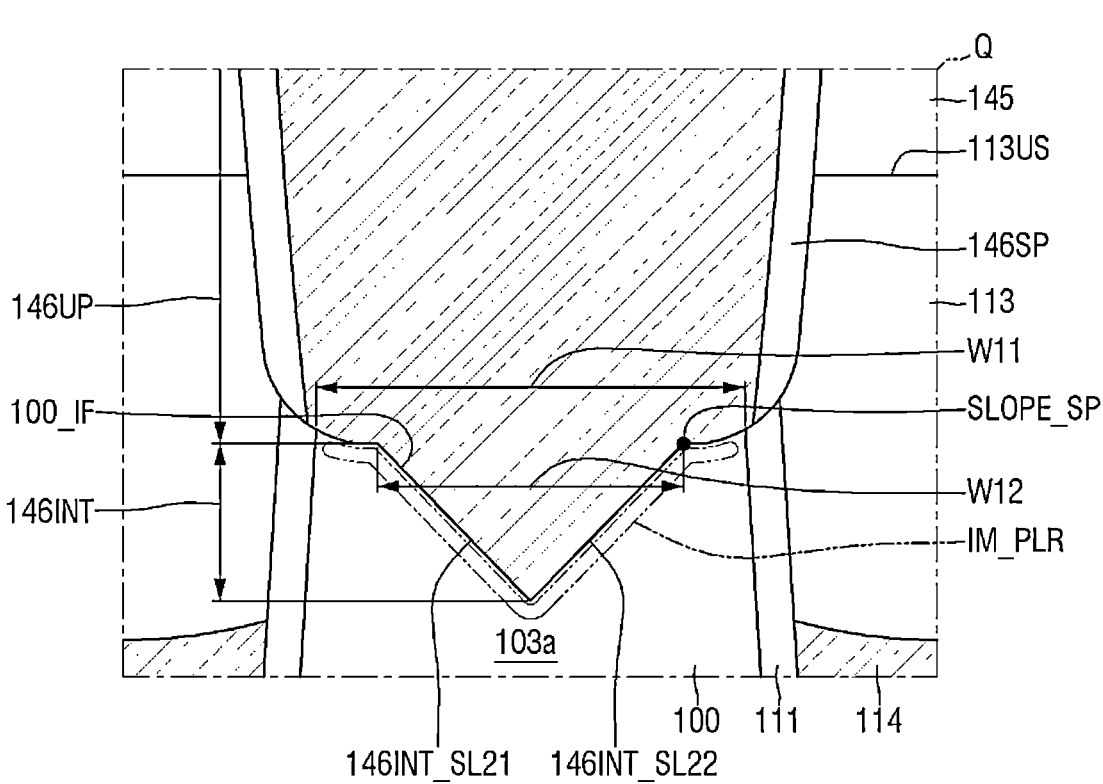
FIG. 7 is an enlarged view of part Q of FIG. 5 according to some embodiments.
Figure 8:
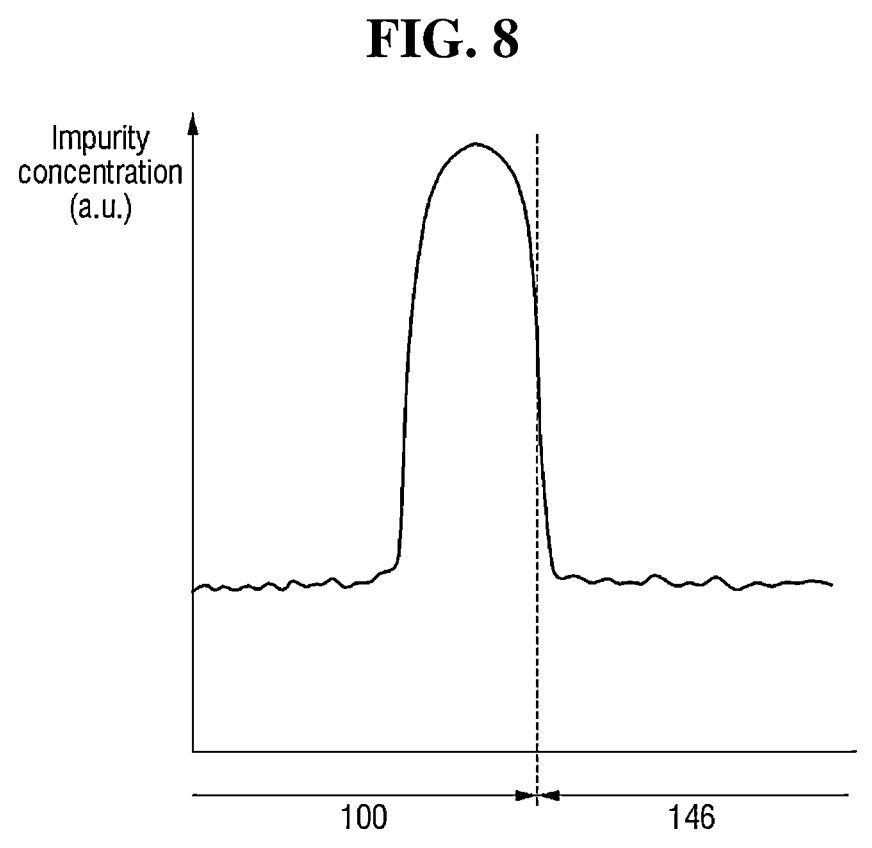

FIG. 1 is a schematic layout of a semiconductor device according to some embodiments. FIG. 2 is a layout illustrating only the word line and active area of FIG. 1 according to some embodiments. FIG. 3 is a view illustrating a boundary surface of a substrate forming a boundary with a bit line contact in an area R of FIG. 2 according to some embodiments. FIG. 4 is an exemplary cross-sectional view taken along line A-A of FIG. 1 according to some embodiments. FIG. 5 is an exemplary cross-sectional view taken along line B-B of FIG. 1 according to some embodiments. FIG. 6 is an enlarged view of part P of FIG. 4 according to some embodiments. FIG. 7 is an enlarged view of part Q of FIG. 5 according to some embodiments. FIG. 8 is a view schematically illustrating a concentration of impurities along a scan line of FIG. 6 according to some embodiments.

In the drawings of the semiconductor memory device according to some embodiments, a dynamic random access memory (DRAM) is illustrated as a memory device. However, embodiments of the present disclosure are not limited thereto.

Referring to FIGS. 1 and 2, the semiconductor memory device according to some embodiments may include a plurality of active areas ACT.

The cell active area ACT may be defined by a cell element separation layer 105 formed in the substrate 100 (see FIG. 4). As a design rule of the semiconductor memory device is reduced, the cell active area ACT may be disposed in a bar shape of a diagonal line or an oblique line, as illustrated. For example, the cell active area ACT may extend in a third direction DR3.

A plurality of gate electrodes crossing the cell active area ACT and extending in a first direction DR1 may be disposed. The plurality of gate electrodes may extend to be parallel to each other. The plurality of gate electrodes may be, for example, a plurality of word lines WL. The word lines WL may be disposed at about equal intervals. A width of the word lines WL or a spacing between the word lines WL may be determined according to a design rule.

Each cell active area ACT may be divided into three portions by two word lines WL extending in the first direction DR1. The cell active area ACT may include storage connection areas 103*b* and a bit line connection area 103*a*. The bit line connection area 103*a* may be located at a central portion of the cell active area ACT, and the storage connection areas 103b may be located at end portions of the cell active area ACT.

For example, the bit line connection area 103a may be an area connected to a bit line BL, and the storage connection areas 103b may be areas connected to an information storage portion 190 (see FIG. 4). For example, the bit line connection area 103a may correspond to a common drain area, and the storage connection area 103b may correspond to a source area. Each word line WL and the bit line connection area 103a and the storage connection area 103b adjacent thereto may constitute a transistor.

A plurality of bit lines BL extending in a second direction DR2 orthogonal to the word line WL may be disposed on the word line WL. The plurality of bit lines BL may extend to be parallel to each other. The bit lines BL may be disposed at about equal intervals. A width of the bit lines BL or a spacing between the bit lines BL may be determined according to a design rule.

A fourth direction DR4 may be orthogonal to the first direction DR1, the second direction DR2, and the third direction DR3. The fourth direction DR4 may be a thickness direction of the substrate 100.

The semiconductor memory device according to some embodiments may include various contact arrangements formed on the cell active area ACT. Various contact arrangements may include, for example, a direct contact DC, a node pad XP, and a landing pad LP.

The direct contact DC may refer to a contact that electrically connects the cell active area ACT to the bit line BL. The node pad XP may be a connection pad that connects the cell active area ACT to a lower electrode 191 (see FIG. 4) of a capacitor. Due to an arrangement structure, a contact area between the node pad XP and the cell active area ACT may be small. Accordingly, a conductive landing pad LP may be introduced to expand a contact area with the cell active area ACT and a contact area with the lower electrode 191 (see FIG. 4) of the capacitor.

The landing pad LP may be disposed between the node pad XP and the lower electrode 191 (see FIG. 4) of the capacitor. By expanding the contact area through the introduction of the landing pad LP, contact resistance between the cell active area ACT and the lower electrode 191 of the capacitor may be reduced.

The direct contact DC may be connected to the bit line connection area 103a. The node pad XP may be connected to the storage connection area 103b.

As the node pad XP is disposed at both ends of the cell active area ACT, the landing pad LP may be disposed adjacent to both ends of the cell active area ACT to at least partially overlap the node pad XP. For example, the node pad XP may be formed to overlap the cell active area ACT and the cell element separation layer 105 (see FIG. 4) between the adjacent word lines WL and between the adjacent bit lines BL.

The word line WL may be formed in a structure buried in the substrate 100. The word line WL may be disposed across the cell active area ACT between the direct contacts DC or the node pads XP. As illustrated, two word lines WL may be disposed to cross one cell active area ACT. As the cell active area ACT extends in the third direction DR3, the word line WL may have an angle of less than about 90 degrees with the cell active area ACT.

The direct contact DC and the node pad XP may be symmetrically disposed. Accordingly, the direct contact DC and the node pad XP may be disposed in a substantially straight line in the first direction DR1 and the second direction DR2. Unlike the direct contact DC and the node pad XP, the landing pad LP may be disposed in a zigzag shape in the second direction DR2 in which the bit line BL extends. In addition, the landing pad LP may be disposed to overlap the same side portion of each bit line BL in the first direction DR1 in which the word line WL extends.

For example, each of the landing pads LP of a first line may overlap a left side of a corresponding bit line BL, and each of the landing pads LP of a second line may overlap a right side of a corresponding bit line BL.

Referring to FIGS. 1 to 8, the semiconductor memory device according to some embodiments may include a plurality of cell gate structures 110, a plurality of bit line structures 140ST, a plurality of node connection pads 125, a plurality of bit line contacts 146, and an information storage portion 190.

The substrate 100 may be a silicon substrate or a silicon-on-insulator (SOI). Alternatively, the substrate 100 may include, for example, silicon germanium, silicon germanium on insulator (SGOI), indium antimonide, lead tellurium compound, indium arsenide, indium phosphide, gallium arsenide, or gallium antimonide, but is not limited thereto.

The cell element separation layer 105 may be formed in the substrate 100. The cell element separation layer 105 may have a shallow trench isolation (STI) structure having excellent element isolation characteristics. The cell element separation layer 105 may define the cell active area ACT in the memory cell area.

The cell active area ACT defined by the cell element separation layer 105 may have a long island shape including a short axis and a long axis as illustrated in FIGS. 1 and 2. The cell active area ACT may have an oblique shape to have an angle of less than about 90 degrees with respect to the word line WL formed in the cell element separation layer 105. In addition, the cell active area ACT may have an oblique shape to have an angle of less than about 90 degrees with respect to the bit line BL formed on the cell element separation layer 105.

The cell element separation layer 105 may include, for example, at least one of a silicon oxide layer, a silicon nitride layer, and a silicon oxynitride layer, but is not limited thereto.

The cell element separation layer 105 is illustrated as being formed as a single insulating layer for convenience of explanation, and embodiments of the present disclosure are not limited thereto. The cell element separation layer 105 may be formed as a single insulating layer or a plurality of insulating layers according to a distance between the adjacent cell active areas ACT according to some embodiments.

In FIGS. 4 and 6, an upper surface 105US of the cell element separation layer and an upper surface of the substrate 100 are illustrated as being on the same plane, for convenience of explanation, and embodiments of the present disclosure are not limited thereto.

The cell gate structure 110 may be formed in the substrate 100 and the cell element separation layer 105. The cell gate structure 110 may be formed across the cell element separation layer 105 and the cell active area ACT defined by the cell element separation layer 105.

The cell gate structure 110 is formed in the substrate 100 and the cell element separation layer 105. The cell gate structure 110 may include a cell gate trench 115, a cell gate insulating layer 111, a cell gate electrode 112, a cell gate capping pattern 113, and a cell gate capping conductive layer 114.

The cell gate electrode 112 may correspond to the word line WL. For example, the cell gate electrode 112 may be the word line WL of FIG. 1. Unlike that illustrated in the drawing, in some embodiments, the cell gate structure 110 does not include the cell gate capping conductive layer 114.

In some embodiments, the cell gate trench 115 may be relatively deep in the cell element separation layer 105 and relatively shallow in the cell active areas ACT. A bottom surface of the word line WL may be curved. That is, a depth of the cell gate trench 115 in the cell element separation layer 105 may be greater than a depth of the cell gate trench 115 in the cell active area ACT.

The cell gate insulating layer 111 may extend along sidewalls and a bottom surface of the cell gate trench 115. The cell gate insulating layer 111 may extend along a profile of at least a portion of the cell gate trench 115.

The cell gate insulating layer 111 may include, for example, at least one of silicon oxide, silicon nitride, silicon oxynitride, and a high-k material having a higher dielectric constant than the silicon oxide. The high-k material may include, for example, at least one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof.

The cell gate electrode 112 may be disposed on the cell gate insulating layer 111. The cell gate electrode 112 may fill a portion of the cell gate trench 115. The cell gate capping conductive layer 114 may extend along an upper surface of the cell gate electrode 112.

The cell gate electrode 112 may include, for example, at least one of a metal, a metal alloy, a conductive metal nitride, a conductive metal carbonitride, a conductive metal carbide, a metal silicide, a doped semiconductor material, a conductive metal oxynitride, and a conductive metal oxide. The cell gate electrode 112 may include, for example, at least one of TiN, TaC, TaN, TiSiN, TaSiN, TaTiN, TiAlN, TaAlN, WN, Ru, TiAl, TiAlC—N, TiAlC, TiC, TaCN, W, Al, Cu, Co, Ti, Ta, Ni, Pt, Ni—Pt, Nb, NbN, NbC, Mo, MoN, MoC, WC, Rh, Pd, Ir, Ag, Au, Zn, V, RuTiN, TiSi, TaSi, NiSi, CoSi, IrOx, RuOx, and combinations thereof, but is not limited thereto.

The cell gate capping conductive layer 114 may include, for example, one of polysilicon, polysilicon-germanium, amorphous silicon, and amorphous silicon-germanium, but is not limited thereto.

The cell gate capping pattern 113 may be disposed on the cell gate electrode 112 and the cell gate capping conductive layer 114. The cell gate capping pattern 113 may fill the cell gate trench 115 remaining after the cell gate electrode 112 and the cell gate capping conductive layer 114 are formed. The cell gate insulating layer 111 is illustrated as extending along sidewalls of the cell gate capping pattern 113, but is not limited thereto.

The cell gate capping pattern 113 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

An upper surface 113US of the cell gate capping pattern is illustrated as being on the same plane as the upper surface 105US of the cell element separation layer, but is not limited thereto.

In some embodiments, an impurity doped area may be formed on at least one side of the cell gate structure 110. The impurity doped area may be a source/drain area of the transistor. The impurity doped area may be formed in the storage connection area 103b and the bit line connection area 103a of FIG. 2.

In FIG. 2, when the transistor including each word line WL and the bit line connection area 103a and the storage connection area 103b adjacent thereto is an n-type metal-oxide semiconductor (NMOS) transistor, the storage connection area 103b and the bit line connection area 103a may include doped n-type impurities, for example, at least one of phosphorus (P), arsenic (As), antimony (Sb), and bismuth (Bi). When the transistor including each word line WL and the bit line connection area 103a and the storage connection area 103b adjacent thereto is a p-type metal-oxide semiconductor (PMOS), the storage connection area 103b and the bit line connection area 103a may include doped p-type impurities, for example, boron (B).

The bit line structure 140ST may include a cell conductive line 140 and a cell line capping layer 144. The cell conductive line 140 may be disposed on the substrate 100 and the cell element separation layer 105 in which the cell gate structure 110 is formed. The cell conductive line 140 may intersect the cell element separation layer 105 and the cell active area ACT defined by the cell element separation layer 105. The cell conductive line 140 may be formed to intersect the cell gate structure 110. The cell conductive line 140 may correspond to the bit line BL. For example, the cell conductive line 140 may be the bit line BL of FIG. 1.

The cell conductive line 140 may include, for example, at least one of a semiconductor material doped with impurities, a conductive silicide compound, a conductive metal nitride, a two-dimensional (2D) material, a metal, and a metal alloy. In the semiconductor memory device according to some embodiments, the 2D material may be a metallic material and/or a semiconductor material. The 2D material may include a two-dimensional allotrope or a two-dimensional compound, and may include, for example, at least one of graphene, molybdenum disulfide (MoS$_2$), molybdenum diselenide (MoSe$_2$), tungsten diselenide (WSe$_2$), and tungsten disulfide (WS$_2$), but is not limited thereto. That is, the above-described 2D material listed are only examples, and the 2D material that may be included in the semiconductor device according to embodiments of the present disclosure is not limited to the above-described material.

For convenience of explanation, the cell conductive line 140 is illustrated as a single layer, and embodiments of the present disclosure are not limited thereto. For example, according to embodiments, the cell conductive line 140 may include a plurality of conductive layers on which conductive materials are stacked.

The cell line capping layer 144 may be disposed on the cell conductive line 140. The cell line capping layer 144 may extend in the second direction DR2 along the upper surface of the cell conductive line 140. The cell line capping layer 144 may include, for example, at least one of a silicon nitride layer, a silicon oxynitride, a silicon carbonitride, and a silicon oxycarbonitride.

In the semiconductor memory device according to some embodiments, the cell line capping layer 144 may include a silicon nitride layer. For convenience of illustration, the cell line capping layer 144 is illustrated as a single layer, and is not limited thereto.

The bit line contact 146 may be formed between the cell conductive line 140 and the substrate 100. The cell conductive line 140 may be disposed on the bit line contact 146.

The bit line contact 146 may be disposed between the bit line connection area 103a of the cell active area ACT and the cell conductive line 140. The bit line contact 146 may be disposed between the cell gate electrodes 112 adjacent in the second direction DR2. The bit line contact 146 may be directly connected to the bit line connection area 103*a*.

In a plan view, the bit line contact 146 may have a circular or elliptical shape. A planar area of the bit line contact 146 may be greater than an overlapping area of the bit line connection area 103*a* and one cell conductive line 140. The planar area of the bit line contact 146 may be larger than that of one bit line connection area 103*a*.

The bit line contact 146 includes an indent area 146INT and an upper area 146UP. The indent area 146INT of the bit line contact may be recessed into the substrate 100. The indent area 146INT of the bit line contact is a portion embedded in the substrate 100.

The upper area 146UP of the bit line contact is disposed on the indent area 146INT of the bit line contact. The upper area 146UP of the bit line contact is directly connected to the indent area 146INT of the bit line contact.

The indent area 146INT of the bit line contact includes a plurality of slopes 146INT_SL11, 146INT_SL12, 146INT_SL21, and 146INT_SL22 forming a boundary with the substrate 100. The plurality of slopes 146INT_SL11, 146INT_SL12, 146INT_SL21, and 146INT_SL22 of the indent area 146INT are planar. In the cross-sectional view, the plurality of slopes 146INT_SL11, 146INT_SL12, 146INT_SL21, and 146INT_SL22 of the indent area 146INT have a substantially straight line shape. Herein, when an element is described as having a substantially straight line shape, it is to be understood that the element may be exactly straight or approximately straight within a measurement error as would be understood by a person having ordinary skill in the art.

In the bit line contact 146, a portion including the plurality of slopes 146INT_SL11, 146INT_SL12, 146INT_SL21, and 146INT_SL22 may be the indent area 146INT of the bit line contact.

In FIGS. 4 and 6, as a distance from the cell conductive line 140 increases, a first slope 146INT_SL11 of the indent area 146INT and a second slope 146INT_SL12 of the indent area 146INT become closer. As the distance from the cell conductive line 140 increases, a width of the indent area 146INT of the bit line contact in the first direction DR1 decreases.

As the distance from the cell conductive line 140 increases, a width of the upper area 146UP of the bit line contact in the first direction DR1 may be constant.

When one end of the first slope 146INT_SL11 of the indent area 146INT meets one end of the second slope 146INT_SL12 of the indent area 146INT, the other end of the first slope 146INT_SL11 of the indent area 146INT and the other end of the second slope 146INT_SL12 of the indent area 146INT are starting points SLOPE_SP of the first slope 146INT_SL11 and the second slope 146INT_SL12.

The starting point SLOPE_SP of the first slope 146INT_SL11 of the indent area 146INT and the starting point SLOPE_SP of the second slope 146INT_SL12 of the indent area 146INT are lower than the upper surface 105US of the element separation layer. In FIG. 6, the starting point SLOPE_SP of the first slope 146INT_SL11 and the starting point SLOPE_SP of the second slope 146INT_SL12 are illustrated as being located at a boundary between the cell element separation layer 105 and the substrate 100, but embodiments are not limited thereto.

The first slope 146INT_SL11 of the indent area 146INT and the second slope 146INT_SL12 of the indent area 146INT do not extend along the cell element separation layer 105. The first slope 146INT_SL11 of the indent area 146INT and the second slope 146INT_SL12 of the indent area 146INT do not include a portion extending along the cell element separation layer 105.

For example, the first slope 146INT_SL11 of the indent area 146INT and the second slope 146INT_SL12 of the indent area 146INT do not include a portion overlapping the cell element separation layer 105. The entirety of the first slope 146INT_SL11 of the indent area 146INT and the entirety of the second slope 146INT_SL12 of the indent area 146INT form a boundary with the substrate 100.

The indent area 146INT of the bit line contact does not include a portion overlapping the cell element separation layer 105 in a fourth direction DR4.

In FIGS. 5 and 7, as a distance from the cell conductive line 140 increases, a third slope 146INT_SL21 of the indent area 146INT and a fourth slope 146INT_SL22 of the indent area 146INT become closer. As the distance from the cell conductive line 140 increases, a width of the indent area 146INT of the bit line contact in the second direction DR2 decreases.

As the distance from the cell conductive line 140 increases, a width of the upper area 146UP of the bit line contact in the second direction DR2 may decrease.

When one end of the third slope 146INT_SL21 of the indent area 146INT meets one end of the fourth slope 146INT_SL22 of the indent area 146INT, the other end of the third slope 146INT_SL21 of the indent area 146INT and the other end of the fourth slope 146INT_SL22 of the indent area 146INT are starting points SLOPE_SP of the third slope 146INT_SL21 and the fourth slope 146INT_SL22.

The starting point SLOPE_SP of the third slope 146INT_SL21 of the indent area 146INT and the starting point SLOPE_SP of the fourth slope 146INT_SL22 of the indent area 146INT are lower than the upper surface 105US of the element separation layer. The starting point SLOPE_SP of the third slope 146INT_SL21 of the indent area 146INT and the starting point SLOPE_SP of the fourth slope 146INT_SL22 of the indent area 146INT are lower than the upper surface 113US of the cell gate capping pattern.

The third slope 146INT_SL21 of the indent area 146INT and the fourth slope 146INT_SL22 of the indent area 146INT do not extend along the cell gate capping pattern 113. The third slope 146INT_SL21 of the indent area 146INT and the fourth slope 146INT_SL22 of the indent area 146INT do not include a portion extending along the cell gate capping pattern 113.

For example, the third slope 146INT_SL21 of the indent area 146INT and the fourth slope 146INT_SL22 of the indent area 146INT do not include a portion overlapping the cell gate capping pattern 113. The entirety of the third slope 146INT_SL21 of the indent area 146INT and the entirety of the fourth slope 146INT_SL22 of the indent area 146INT form a boundary with the substrate 100.

In the semiconductor memory device according to some embodiments, a width W11 of the bit line contact 146 in contact with the substrate 100 in the second direction DR2 is greater than a width W12 of the indent area 146INT of the bit line contact in the second direction DR2.

In a plan view, the upper area 146UP of the bit line contact may have a circular or elliptical shape. A planar area of the upper area 146UP of the bit line contact may be greater than an overlapping area of the bit line connection area 103*a* and one cell conductive line 140. The planar area of the upper area 146UP of the bit line contact may be larger than that of one bit line connection area 103*a*.

In FIG. 3, in a plan view, the indent area 146INT of the bit line contact may have, for example, a diamond shape. For example, the indent area 146INT of the bit line contact may have a quadrangular pyramid shape.

The substrate 100 includes inclined boundary surfaces 100_IF that form a boundary with the indent area 146INT of the bit line contact. The inclined boundary surface 100_IF may include first to fourth indent boundary surfaces 100_IF1, 100_IF2, 100_IF3, and 100_IF4.

The slopes 146INT_SL11, 146INT_SL12, 146INT_SL21, and 146INT_SL22 of the indent area 146INT of the bit line contact form a boundary with the inclined boundary surface 100_IF of the substrate. The slopes 146INT_SL11, 146INT_SL12, 146INT_SL21, and 146INT_SL22 of the indent area 146INT of the bit line contact are in direct contact with the inclined boundary surface 100_IF of the substrate.

When the substrate 100 is a silicon substrate, the first to fourth indent boundary surfaces 100_IF1, 100_IF2, 100_IF3, and 100_IF4 may belong to a {111} crystal plane group of silicon.

An impurity pile-up area IM_PLR may be formed in the substrate 100. The impurity pile-up area IM_PLR may be formed near a boundary with the bit line contact 146. The impurity pile-up area IM_PLR may be formed along a boundary between the substrate 100 and the bit line contact 146.

The impurity pile-up area IM_PLR may be formed along the slopes 146INT_SL11, 146INT_SL12, 146INT_SL21, and 146INT_SL22 of the indent area 146INT of the bit line contact. The impurity pile-up area IM_PLR may be formed along the inclined boundary surface 100_IF of the substrate.

In FIGS. 6 and 8, the impurity pile-up area IM_PLR may be an area in which more impurities are collected than other areas of the substrate 100. The impurity pile-up area IM_PLR may be an area in which impurities are piled up.

FIG. 8 does not mean that an area of the substrate 100 other than the impurity pile-up area IM_PLR does not include impurities piled up in the impurity pile-up area IM_PLR. FIG. 8 does not mean that the bit line contact 146 does not include impurities piled up in the impurity pile-up area IM_PLR.

The impurities piled up in the impurity pile-up area IM_PLR may include, for example, at least one of an n-type impurity, a p-type impurity, carbon, nitrogen, and a halogen element. When the bit line connection area 103a is doped with an n-type impurity, the impurities piled up in the impurity pile-up area IM_PLR may include, for example, at least one of phosphorus (P), arsenic (As), antimony (Sb), and bismuth (Bi). When the bit line connection area 103a is doped with a p-type impurity, the impurities piled up in the impurity pile-up area IM_PLR may include, for example, boron (B).

In a manufacturing process of forming the bit line contact 146, an etching process of forming the inclined boundary surface 100_IF of the substrate 100 may be performed. When the inclined boundary surface 100_IF of the substrate 100 is formed using an etchant containing a halogen element, the impurities piled up in the impurity pile-up area IM_PLR may be the halogen element. For example, the impurities piled up in the impurity pile-up area IM_PLR may include chlorine (Cl) or bromine (Br), but are not limited thereto.

In the manufacturing process of forming the bit line contact 146, a silicon precursor including carbon or nitrogen may be used for the bit line contact 146. In this case, the impurities piled up in the impurity pile-up area IM_PLR may include, for example, at least one of carbon and nitrogen.

In the semiconductor memory device according to some embodiments, the impurities piled up in the impurity pile-up area IM_PLR may include at least one of, for example, carbon, nitrogen, a halogen element, and phosphorus.

The bit line contact 146 may include an upper surface 146US connected to the cell conductive line 140. The upper surface 146US of the bit line contact is included in the upper area 146UP of the bit line contact.

The bit line contact 146 may electrically connect the cell conductive line 140 and the substrate 100. The bit line contact 146 may correspond to the direct contact DC. The bit line contact 146 may include, for example, a semiconductor material doped with impurities.

The node connection pad 125 may be disposed on the substrate 100. The node connection pad 125 may be disposed on the storage connection area 103b of the cell active area ACT. The node connection pad 125 is connected to the storage connection area 103b.

The node connection pad 125 may be disposed between the cell conductive lines 140 adjacent in the first direction DR1. In some embodiments, the node connection pad 125 may be disposed between the cell gate electrodes 112 adjacent in the second direction DR2.

Based on the upper surface 105US of the cell element separation layer, an upper surface 125US of the node connection pad is lower than the upper surface 146US of the bit line contact. Based on the upper surface 105US of the cell element separation layer, the upper surface 125US of the node connection pad is lower than the bottom surface of the cell conductive line 140.

The node connection pad 125 may electrically connect the information storage portion 190 and the substrate 100. The node connection pad 125 may correspond to the node pad XP. The node connection pad 125 may include, for example, at least one of a semiconductor material doped with impurities, a conductive silicide compound, a conductive metal nitride, a metal, and a metal alloy.

A pad separation structure 145ST may separate the node connection pads 125 adjacent in the first direction DR1. In some embodiments, the pad separation structure 145ST may separate the node connection pads 125 adjacent in the second direction DR2. The pad separation structure 145ST covers the upper surface 125US of the node connection pad.

The pad separation structure 145ST may include a pad separation pattern 145 and an upper cell insulating layer 130. The upper cell insulating layer 130 may be disposed on the pad separation pattern 145.

When the node connection pad 125 includes a first node connection pad and a second node connection pad spaced apart from each other in the first direction DR1, the pad separation pattern 145 may separate the first node connection pad and the second node connection pad in the first direction DR1. In some embodiments, the pad separation pattern 145 may also separate the node connection pads 125 adjacent in the second direction DR2.

The upper cell insulating layer 130 covers the upper surface 125US of the node connection pad. When the node connection pad 125 includes the first node connection pad and the second node connection pad spaced apart from each other in the first direction DR1, the upper cell insulating layer 130 may cover an upper surface of the first node connection pad and an upper surface of the second node connection pad.

An upper surface 130US of the upper cell insulating layer may be on the same plane as the upper surface 146US of the bit line contact. That is, a height of the upper surface 130US of the upper cell insulating layer may be substantially the same as a height of the upper surface 146US of the bit line contact with respect to the upper surface 105US of the cell element separation layer.

The pad separation pattern 145 and the upper cell insulating layer 130 may be disposed between the bit line contacts 146 adjacent in the second direction DR2. The cell conductive line 140 may be disposed on the upper surface of the pad separation structure 145ST. The cell conductive line 140 may be disposed on the upper surface 130US of the upper cell insulating layer. The upper surface of the pad separation structure 145ST may be the upper surface 130US of the upper cell insulating layer. The upper surface of the pad separation structure 145ST may be on the same plane as a bottom surface of the cell conductive line 140.

In FIGS. 5 and 7, a bit line contact spacer 146SP may be disposed between the bit line contact 146 and the pad separation pattern 145. The bit line contact spacer 146SP may be disposed along the sidewalls of the upper area 146UP of the bit line contact. The bit line contact spacers 146SP disposed on the sidewalls of the upper area 146UP of the bit line contact are spaced apart from each other in the second direction DR2.

The bit line contact spacer 146SP may include, for example, at least one of silicon nitride (SiN), silicon oxynitride (SiON), and silicon oxide (SiO2). The bit line contact spacer 146SP is illustrated as a single layer for convenience of explanation, and embodiments of the present disclosure are not limited thereto.

The pad separation pattern 145 may include, for example, at least one of silicon nitride (SiN), silicon oxynitride (SiON), silicon oxide (SiO$_2$), silicon carbonitride (SiCN), silicon oxycarbonitride (SiOCN), and combinations thereof. The upper cell insulating layer 130 may be a single layer, but as illustrated, the upper cell insulating layer 130 may also be a multilayer including a first upper cell insulating layer 131 and a second upper cell insulating layer 132 according to some embodiments. For example, the first upper cell insulating layer 131 may include a silicon oxide layer, and the second upper cell insulating layer 132 may include a silicon nitride layer, but embodiments are not limited thereto. A width of the upper cell insulating layer 130 in the first direction DR1 is illustrated as decreasing as a distance from the substrate 100 increases, but is not limited thereto.

A bit line spacer 150 may be disposed on sidewalls of the cell conductive line 140 and the cell line capping layer 144.

In the portion of the cell conductive line 140 where the bit line contact 146 is formed, the bit line spacer 150 may be disposed on the sidewalls of the cell conductive line 140, the cell line capping layer 144, and the bit line contact 146. In FIGS. 4 and 6, the bit line spacer 150 may be disposed on the sidewall of the cell conductive line 140, the sidewall of the cell line capping layer 144, and the sidewall of the upper area 146UP of the bit line contact. The bit line spacer 150 may be disposed on the indent area 1461NT of the bit line contact. That is, the indent area 1461NT of the bit line contact is disposed on a lower side of the bit line spacer 150.

In the remaining portion of the cell conductive line 140 where the bit line contact 146 is not formed, the bit line spacer 150 may be disposed on the upper cell insulating layer 130.

The bit line spacer 150 is illustrated as a single layer for convenience of explanation, and embodiments of the present disclosure are not limited thereto. That is, unlike illustrated in the drawing, according to some embodiments, the bit line spacer 150 may have a multilayer structure. The bit line spacer 150 may include, for example, one of a silicon oxide layer, a silicon nitride layer, a silicon oxynitride layer (SiON), a silicon oxycarbonitride layer (SiOCN), air, and a combination thereof, but is not limited thereto.

A storage pad 160 may be disposed on each node connection pad 125. The storage pad 160 may be electrically connected to the node connection pad 125. The storage pad 160 may be connected to the storage connection area 103b of the cell active area ACT. The storage pad 160 may correspond to the landing pad LP.

In the semiconductor memory device according to some embodiments, the storage pad 160 may extend to the node connection pad 125 to be connected to the node connection pad 125. The storage pad 160 may overlap a portion of the upper surface of the bit line structure 140ST.

The storage pad 160 may include, for example, at least one of a semiconductor material doped with impurities, a conductive silicide compound, a conductive metal nitride, a conductive metal carbide, a metal, and a metal alloy.

A pad separation insulating layer 180 may be formed on the storage pad 160 and the bit line structure 140ST. For example, the pad separation insulating layer 180 may be disposed on the cell line capping layer 144. The pad separation insulating layer 180 may define the storage pad 160 forming a plurality of isolation areas.

The pad separation insulating layer 180 does not cover an upper surface 160US of the storage pad. The pad separation insulating layer 180 may fill a pad separation recess. The pad separation recess may separate the storage pads 160 adjacent to each other. For example, the upper surface 160US of the storage pad may be on the same plane as an upper surface 180US of the pad separation insulating layer.

The pad separation insulating layer 180 may include an insulating material and may electrically separate the plurality of storage pads 160 from each other. The pad separation insulating layer 180 may include, for example, at least one of a silicon oxide layer, a silicon nitride layer, a silicon oxynitride layer, a silicon oxycarbonitride layer, and a silicon carbonitride layer, but is not limited thereto.

An etching stop layer 295 may be disposed on the storage pad 160 and the pad separation insulating layer 180. The etching stop layer 295 may include at least one of, for example a silicon nitride layer, a silicon carbonitride layer, a silicon boronitride layer (SiBN), a silicon oxynitride layer, and a silicon oxycarbide layer.

The information storage portion 190 may be disposed on the storage pad 160. The information storage portion 190 may be electrically connected to the storage pad 160. A portion of the information storage portion 190 may be disposed in the etching stop layer 295.

The information storage portion 190 may include, for example, a capacitor, but is not limited thereto. The information storage portion 190 includes a lower electrode 191, a capacitor dielectric layer 192, and an upper electrode 193. For example, the upper electrode 193 may be a plate upper electrode having a plate shape.

The lower electrode 191 may be disposed on the storage pad 160. The lower electrode 191 is illustrated as having a pillar shape, but is not limited thereto. The lower electrode 191 may also have a cylindrical shape.

The capacitor dielectric layer 192 is formed on the lower electrode 191. The capacitor dielectric layer 192 may be formed along a profile of the lower electrode 191. The upper electrode 193 is formed on the capacitor dielectric layer 192. The upper electrode 193 may surround an outer sidewall of the lower electrode 191. The upper electrode 193 is illustrated as a single layer for convenience of explanation, and embodiments of the present disclosure are not limited thereto.

The lower electrode 191 and the upper electrode 193 may each include, for example, a doped semiconductor material, a conductive metal nitride (e.g., a titanium nitride, a tantalum nitride, a niobium nitride, a tungsten nitride, etc.), a metal (e.g., ruthenium, iridium, titanium, tantalum, etc.), a conductive metal oxide (e.g., an iridium oxide, a niobium oxide, etc.), etc., but is not limited thereto.

The capacitor dielectric layer 192 may include, for example, one of silicon oxide, silicon nitride, silicon oxynitride, a high-k material, and combinations thereof, but is not limited thereto. In the semiconductor memory device according to some embodiments, the capacitor dielectric layer 192 may include a stacked layer structure in which zirconium oxide, aluminum oxide, and zirconium oxide are sequentially stacked. In the semiconductor memory device according to some embodiments, the capacitor dielectric layer 192 may include a dielectric layer including hafnium (Hf). In the semiconductor memory device according to some embodiments, the capacitor dielectric layer 192 may have a stacked layer structure of a ferroelectric material layer and a paraelectric material layer.

Figure 9:
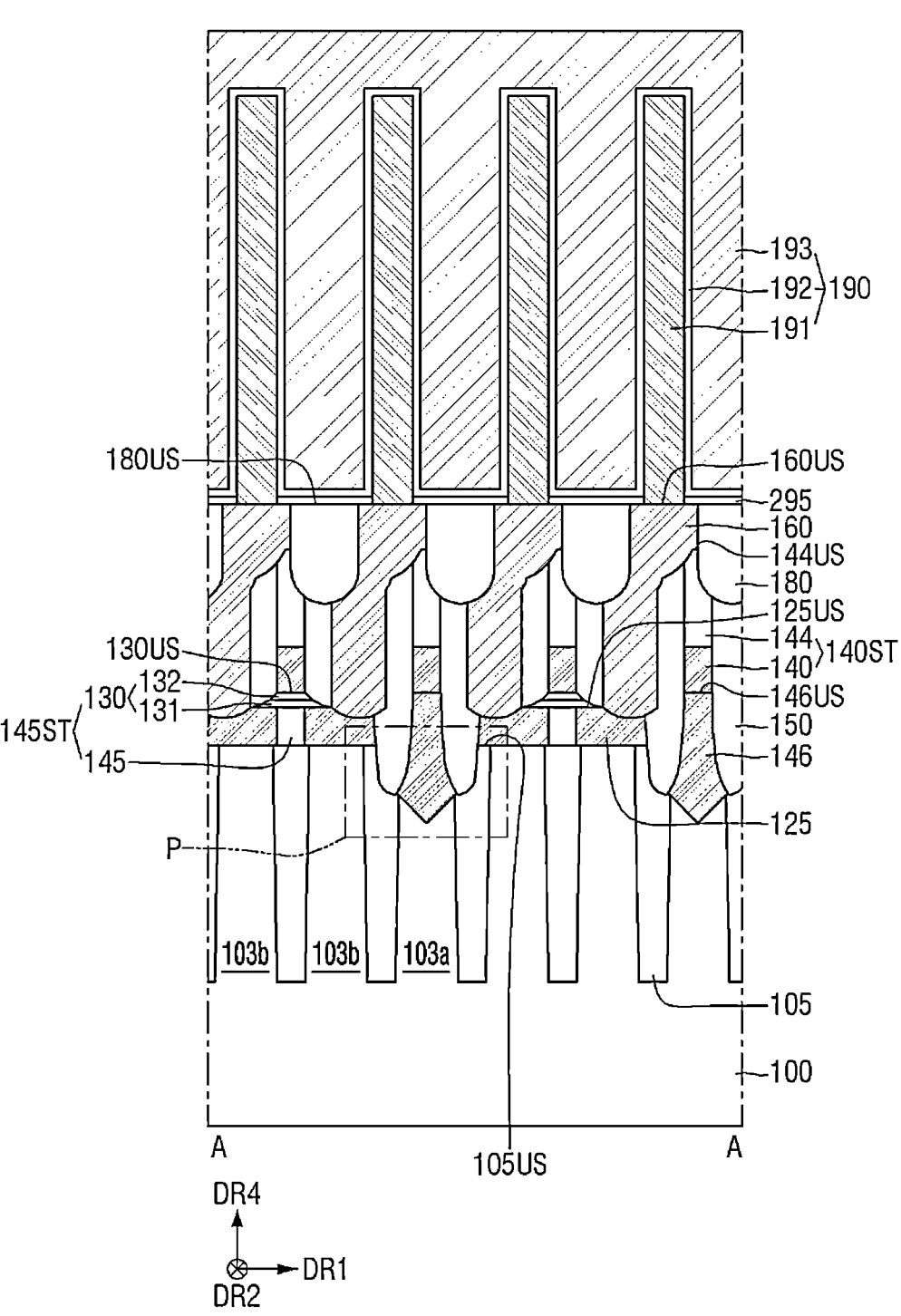
FIGS. 9 and 10 are views illustrating a semiconductor device according to some embodiments.
Figure 10:
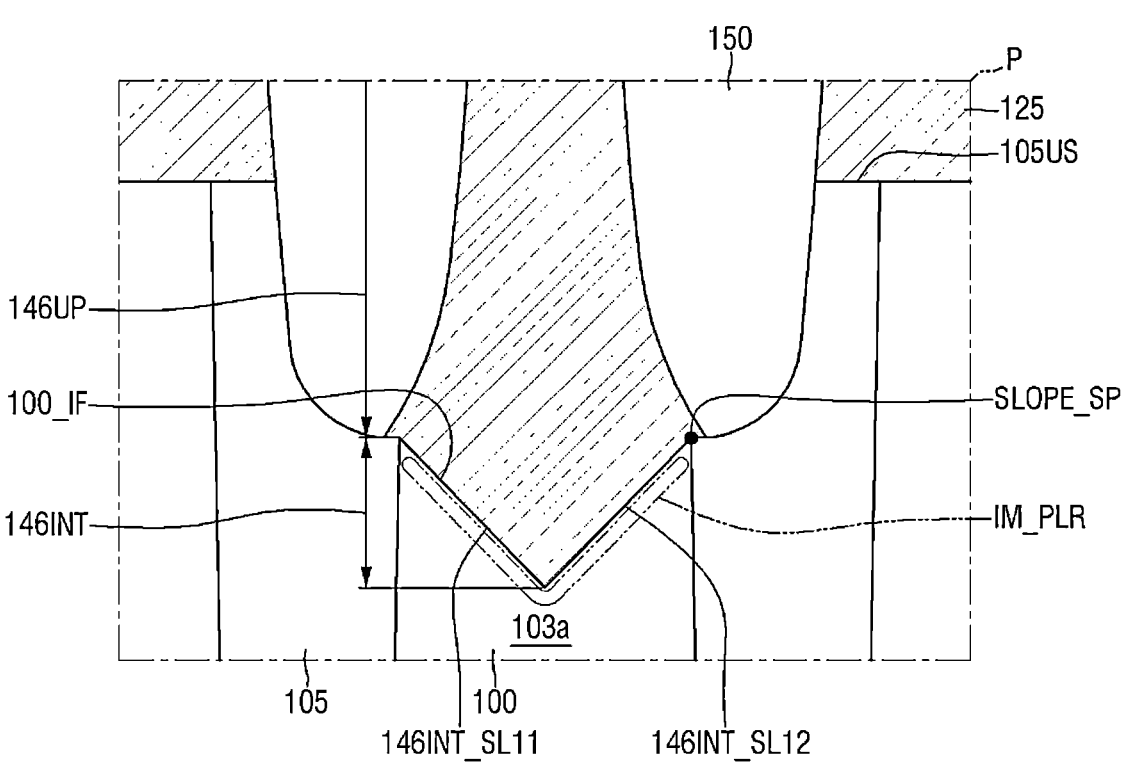

FIGS. 9 and 10 are views illustrating a semiconductor device according to some embodiments. For convenience of explanation, a further description of technical aspects and components previously described may be omitted. For reference, FIG. 10 is an enlarged view of part P of FIG. 9 according to some embodiments.

Referring to FIGS. 9 and 10, in a semiconductor memory device according to some embodiments, the upper area 146UP of the bit line contact may include a portion in which a width of the upper area 146UP of the bit line contact in the first direction DR1 increases as a distance from the cell conductive line 140 increases.

A portion of the upper area 146UP of the bit line contact is illustrated as overlapping the cell element separation layer 105 in the fourth direction DR4, but is not limited thereto.

Figure 11:
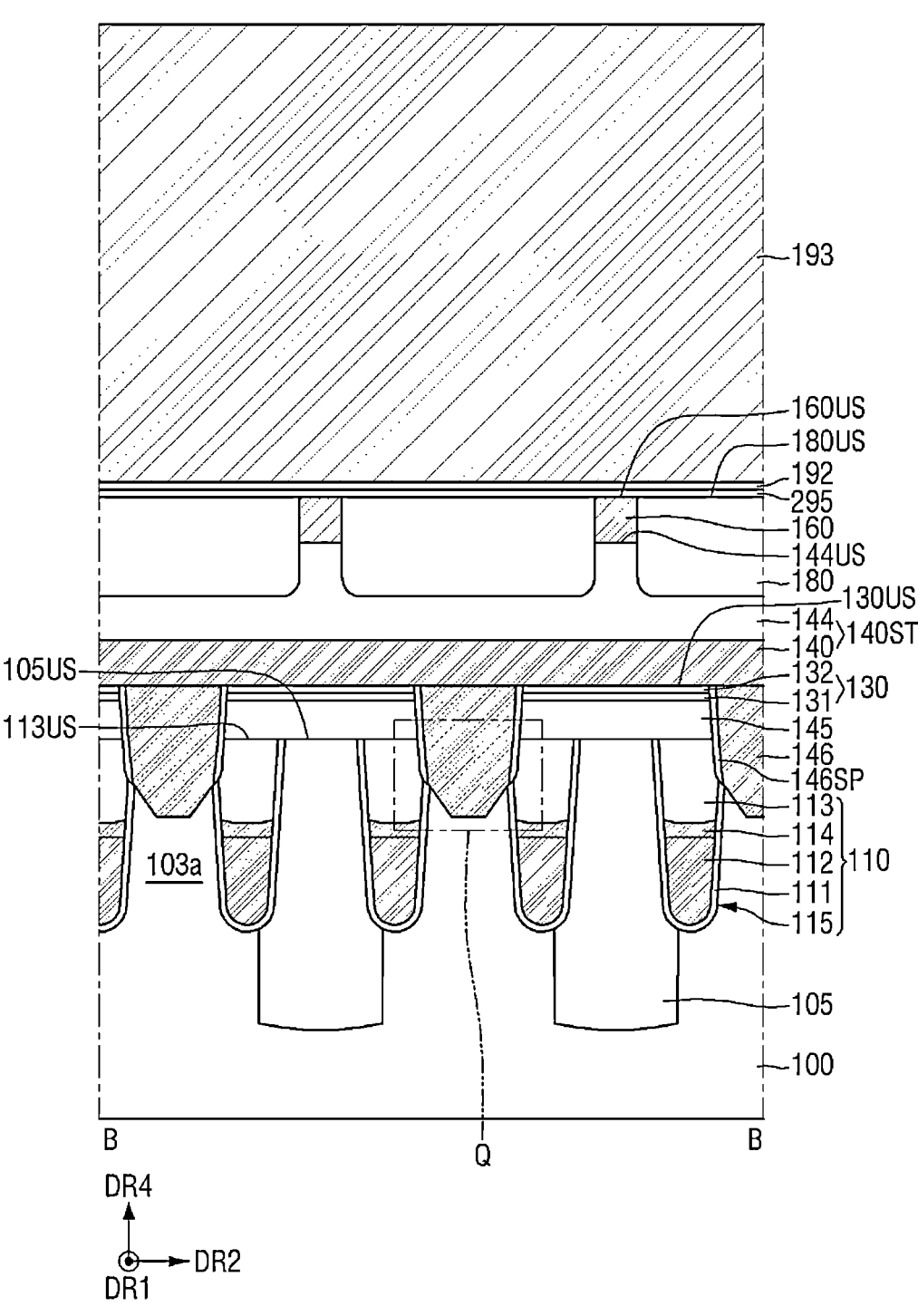
FIGS. 11 and 12 are views illustrating a semiconductor memory device according to some embodiments.
Figure 12:
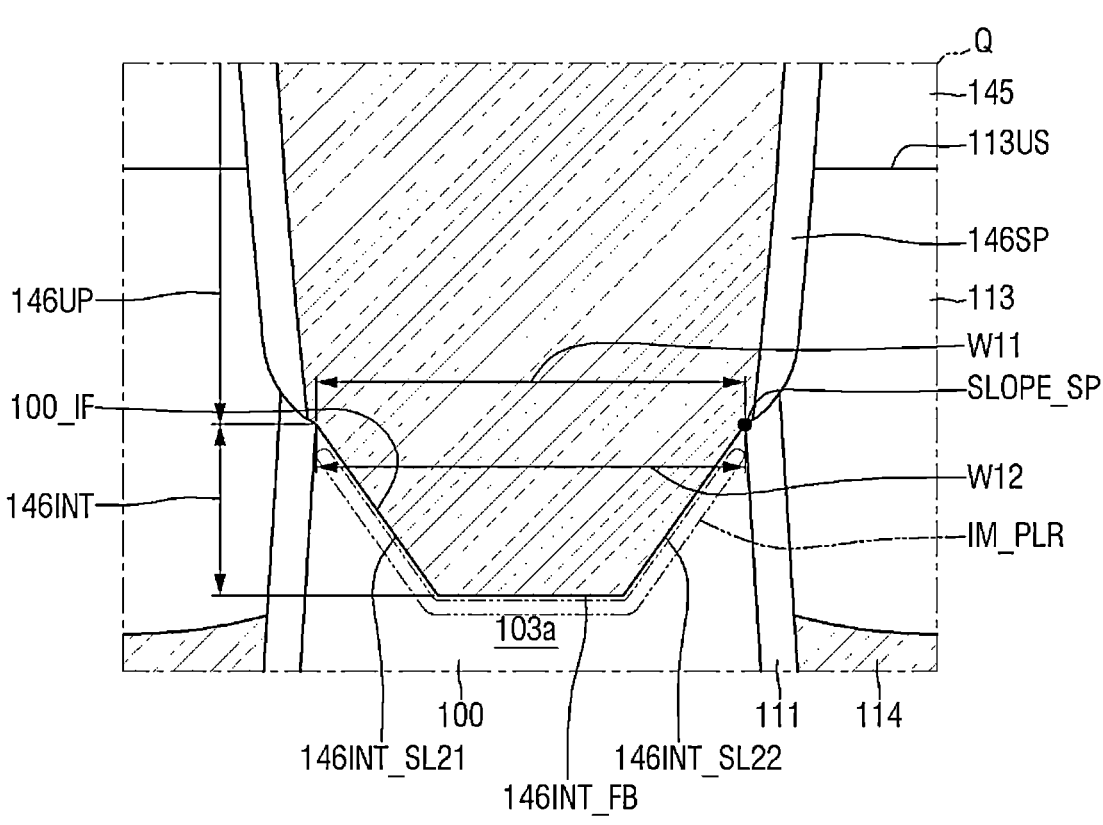
Figure 13:
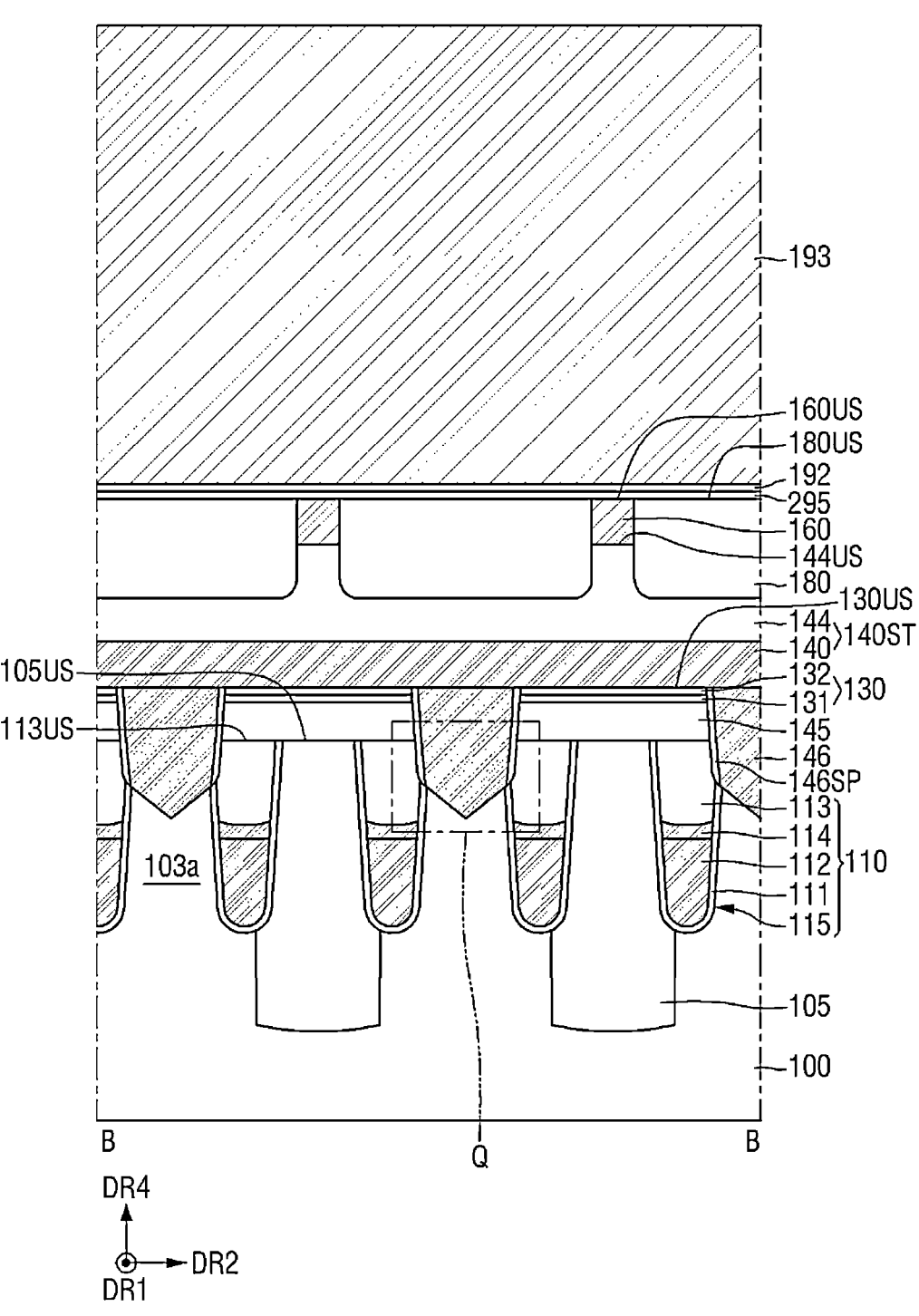
FIGS. 13 and 14 are views illustrating a semiconductor memory device according to some embodiments.
Figure 14:
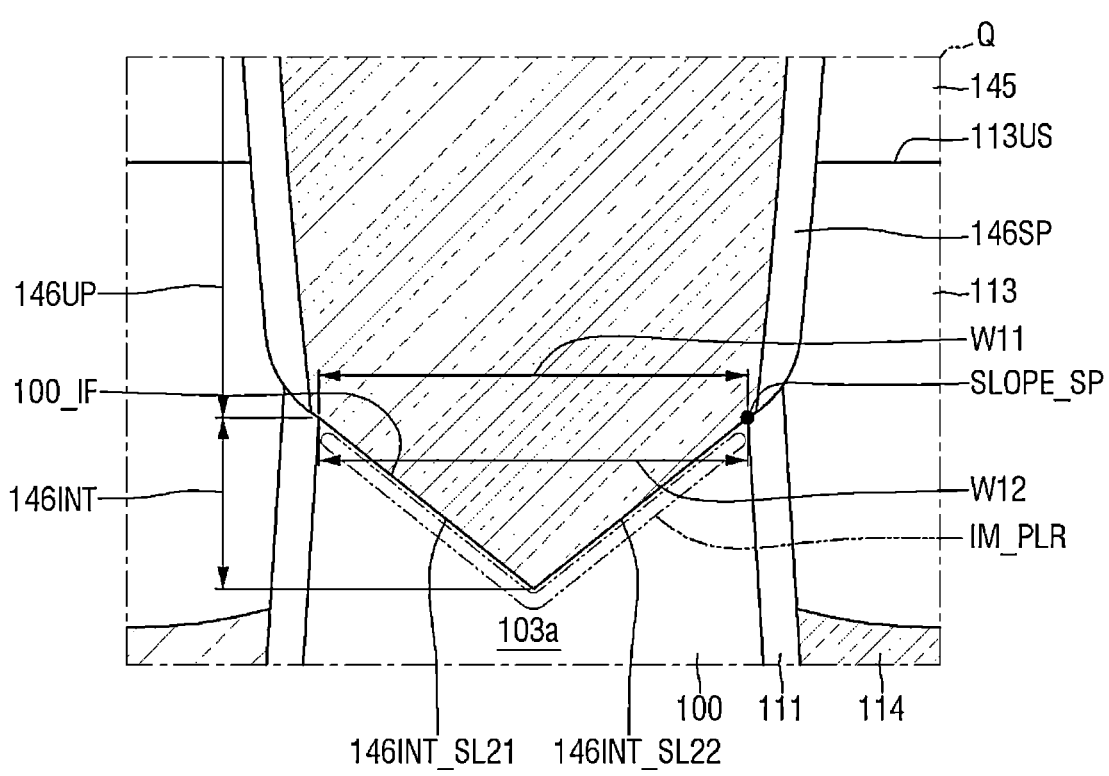

FIGS. 11 and 12 are views illustrating a semiconductor memory device according to some embodiments. FIGS. 13 and 14 are views illustrating a semiconductor memory device according to some embodiments. For convenience of explanation, a further description of technical aspects and components previously described may be omitted. For reference, FIG. 12 is an enlarged view of part Q of FIG. 11 according to some embodiments, and FIG. 14 is an enlarged view of part Q of FIG. 13 according to some embodiments.

Referring to FIGS. 11 to 14, in the semiconductor memory device according to some embodiments, a width W11 of the bit line contact 146 in contact with the substrate 100 in the second direction DR2 is the same as a width W12 of the indent area 1461NT of the bit line contact in the second direction DR2.

The starting point SLOPE_SP of the third slope 1461NT_SL21 and the starting point SLOPE_SP of the fourth slope 146INT_SL22 may be located at a boundary between the cell gate insulating layer 111 and the substrate 100.

In FIGS. 11 and 12, the indent area 1461NT of the bit line contact may include a bottom surface 1461NT_FB connecting the third slope 146INT_SL21 of the indent area 1461NT and the fourth slope 146INT_SL22 of the indent area 1461NT.

In the cross-sectional view, the bottom surface 1461NT_FB of the indent area 1461NT has a substantially straight line shape.

In FIGS. 13 and 14, the third slope 146INT_SL21 of the indent area 1461NT and the fourth slope 146INT_SL22 of the indent area 1461NT may directly meet.

Figure 15:
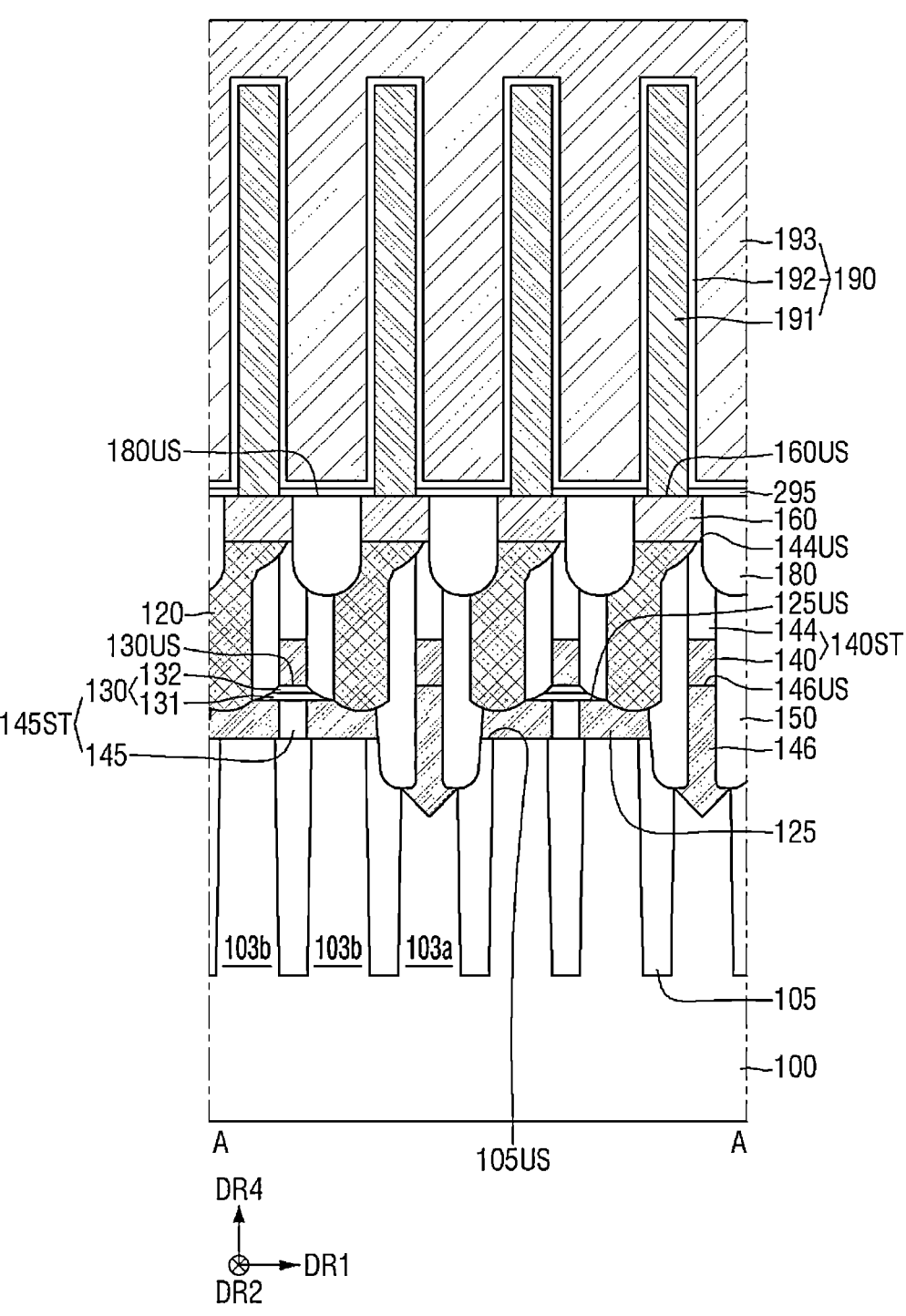
FIGS. 15 and 16 are views illustrating a semiconductor device according to some embodiments, respectively.
Figure 16:
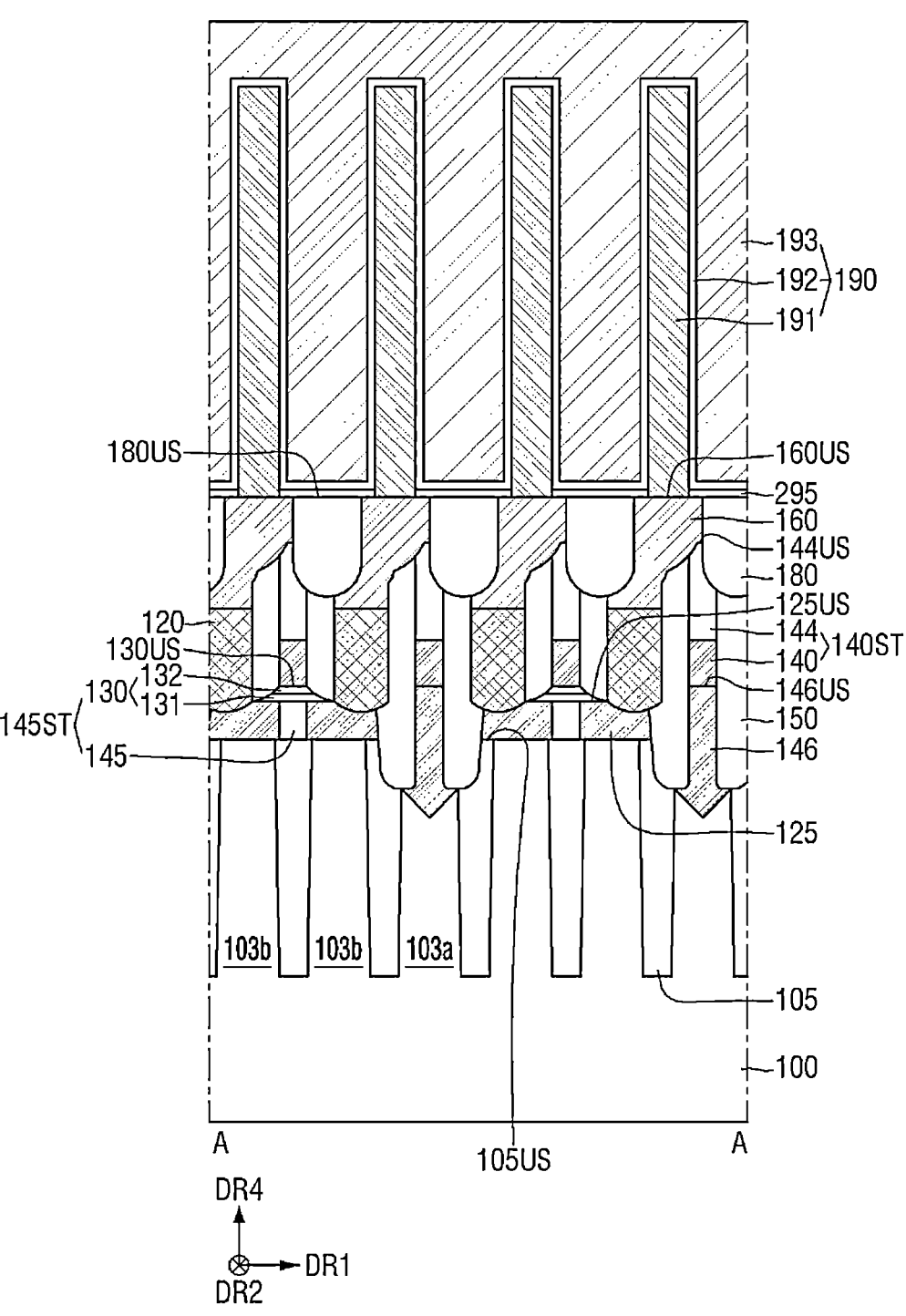

FIGS. 15 and 16 are views illustrating a semiconductor device according to some embodiments, respectively. For convenience of explanation, a further description of technical aspects and components previously described may be omitted.

Referring to FIGS. 15 and 16, the semiconductor memory device according to some embodiments may further include a storage contact 120 disposed between the node connection pad 125 and the storage pad 160.

The storage contact 120 connects the node connection pad 125 and the storage pad 160. The storage contact 120 may include, for example, at least one of a semiconductor material doped with impurities, a conductive silicide compound, a conductive metal nitride, a metal, and a metal alloy.

In FIG. 15, an upper surface of the storage contact 120 may be on the same plane as an upper surface 144US of the cell line capping layer.

In FIG. 16, the upper surface of the storage contact 120 is lower than the upper surface 144US of the cell line capping layer.

Figure 17:
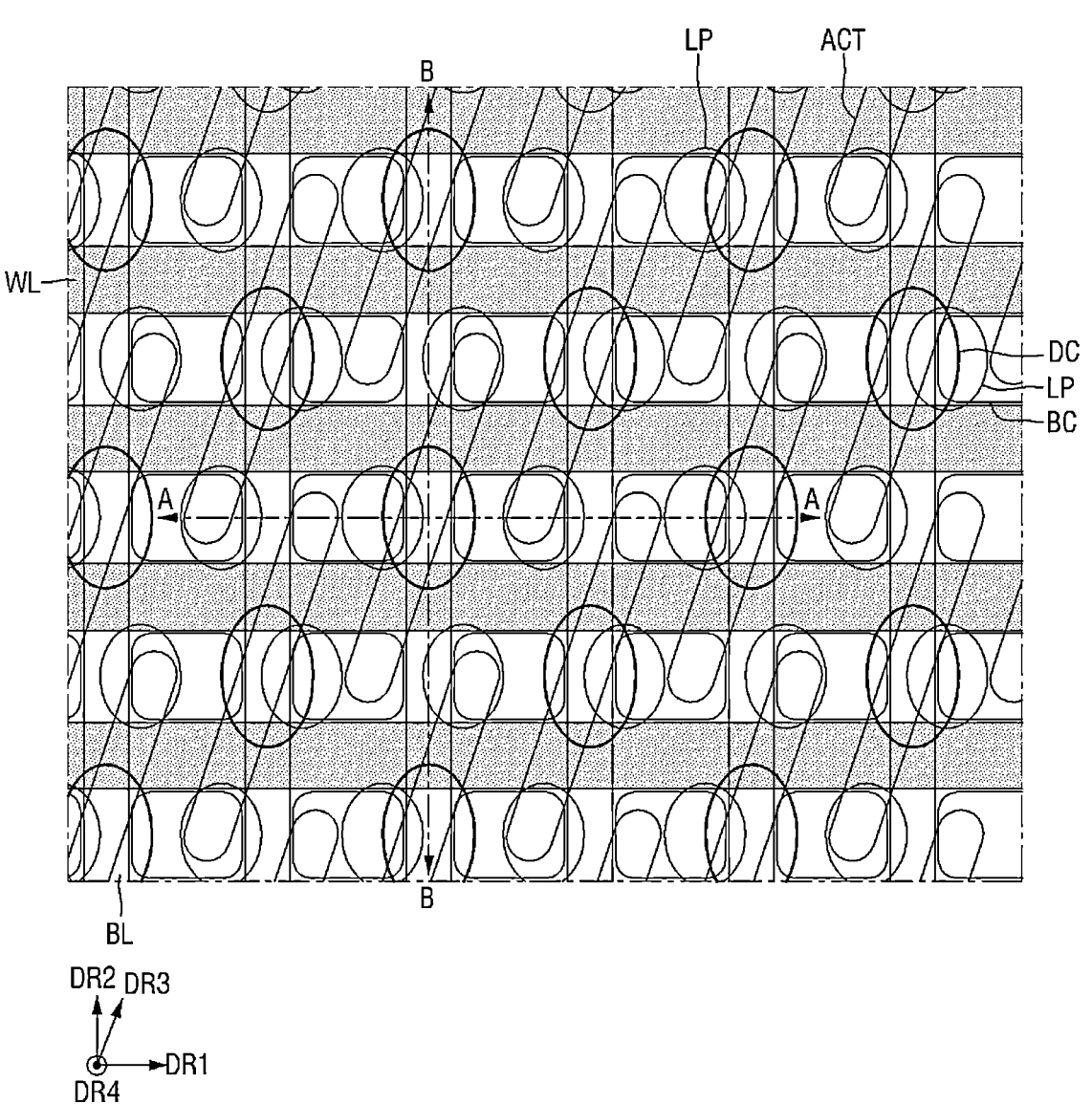
FIGS. 17 to 19 are views illustrating a semiconductor memory device according to some embodiments.
Figure 18:
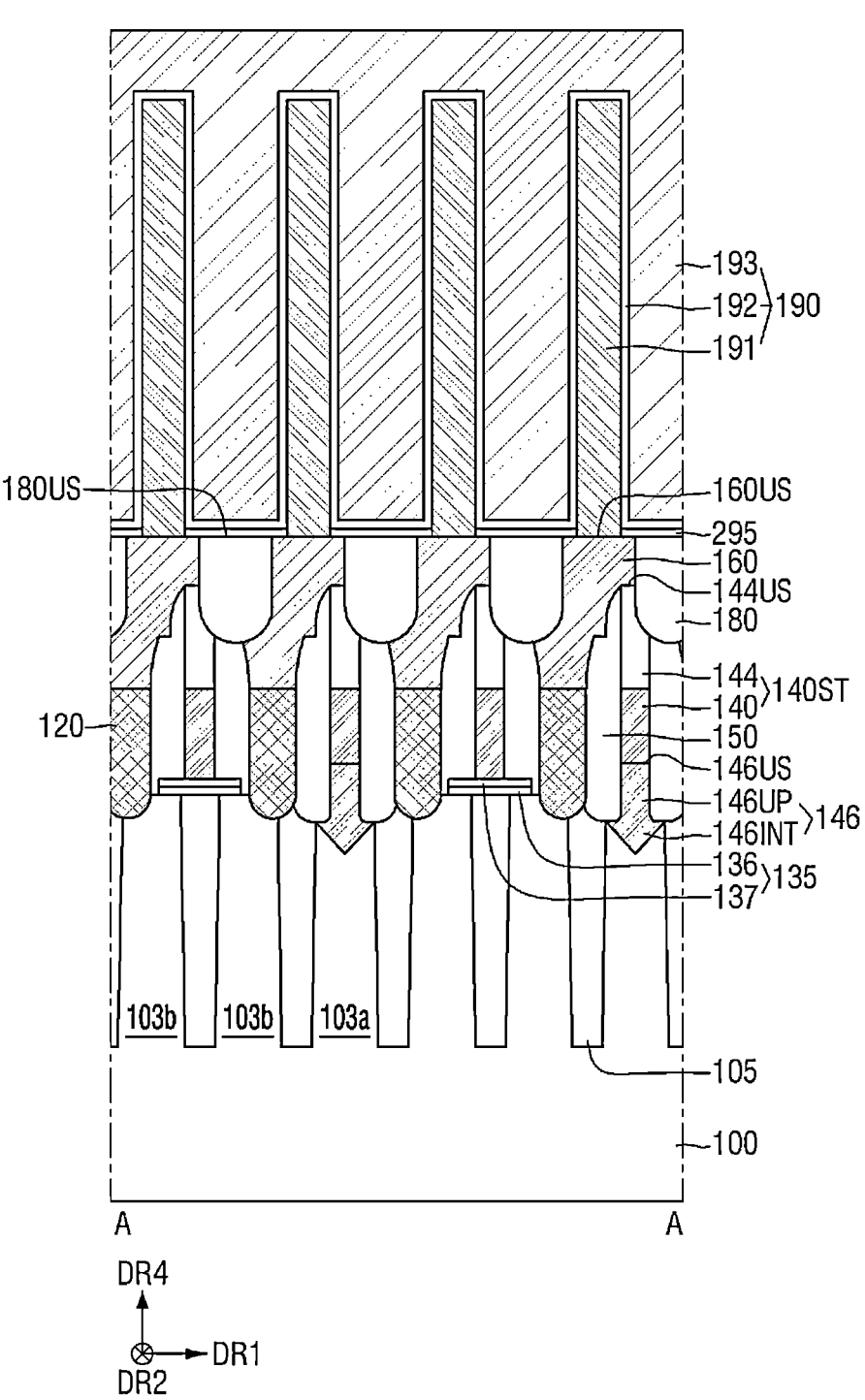
Figure 19:
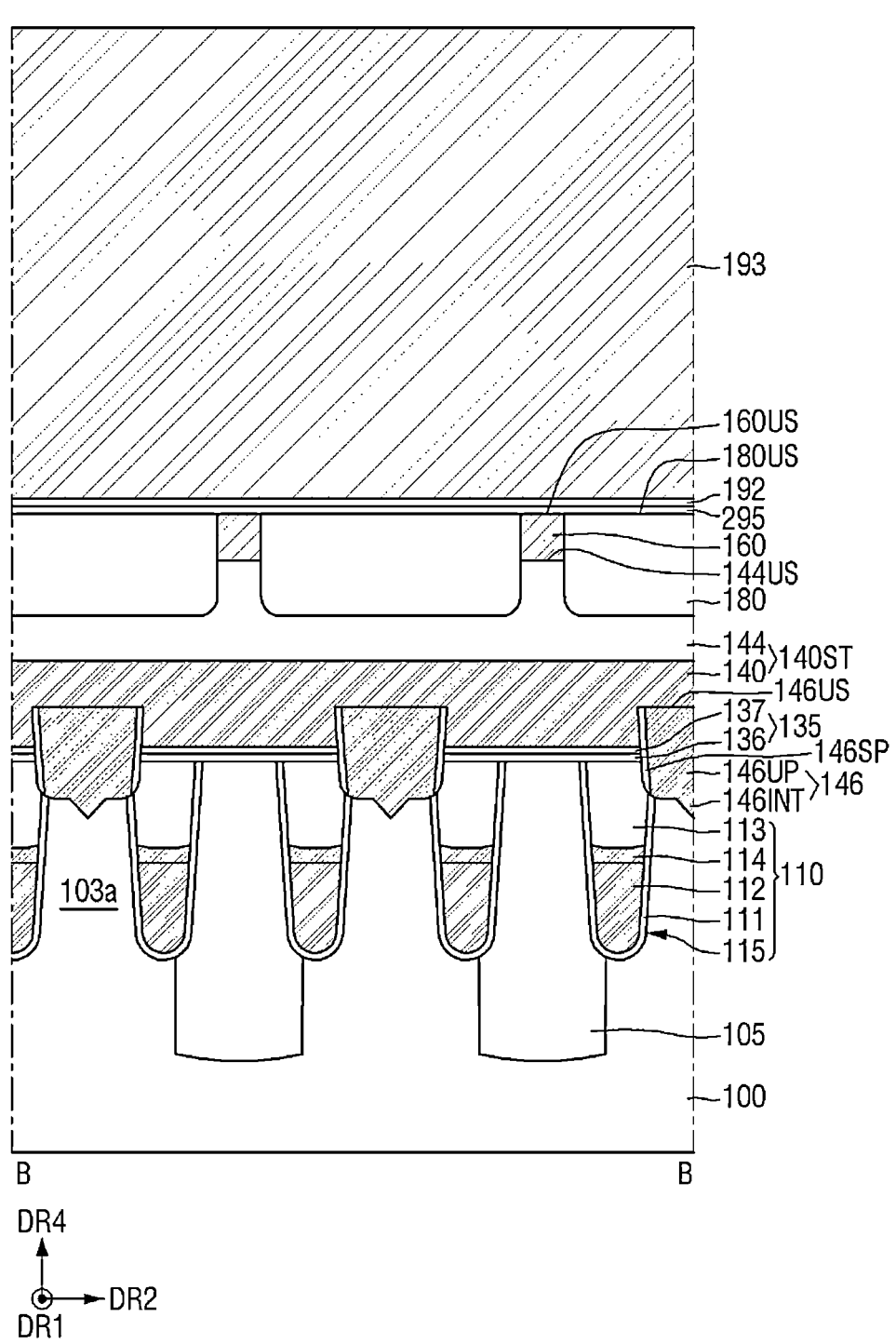

FIGS. 17 to 19 are views illustrating a semiconductor memory device according to some embodiments. For convenience of explanation, a further description of technical aspects and components previously described may be omitted.

For reference, FIG. 17 is a schematic layout of a semiconductor device according to some embodiments. FIGS. 18 and 19 are cross-sectional views taken along lines A-A and B-B of FIG. 17, respectively, according to some embodiments.

Referring to FIGS. 17 to 19, the semiconductor memory device according to some embodiments includes the buried contact BC connecting the cell active area ACT to the lower electrode 191 of the capacitor, but does not include the node pad XP (see FIG. 1).

The landing pad LP may be disposed between the buried contact BC and the lower electrode 191 of the capacitor.

A lower cell insulating layer 135 may be formed on the substrate 100 and the cell element separation layer 105. For example, the lower cell insulating layer 135 may be disposed on the substrate 100 and the cell element separation layer 105 on which the bit line contact 146 is not formed. The lower cell insulating layer 135 may be disposed between the substrate 100 and the cell conductive line 140 and between the cell element separation layer 105 and the cell conductive line 140.

The lower cell insulating layer 135 may be a single layer, but as illustrated, the lower cell insulating layer 135 may be a multilayer including a first lower cell insulating layer 136 and a second lower cell insulating layer 137 in some embodiments. For example, the first lower cell insulating layer 136 may include a silicon oxide layer, and the second lower cell insulating layer 137 may include a silicon nitride layer, but embodiments are not limited thereto. Unlike illustrated in the drawing, the lower cell insulating layer 137 may also include three or more insulating layers according to some embodiments.

A portion of the bit line contact 146 may be recessed into the cell conductive line 140. For example, a portion of the upper area 146UP of the bit line contact may be recessed into the cell conductive line 140.

The upper surface 146US of the bit line contact may protrude higher than an upper surface of the lower cell insulating layer 135. Based on the upper surface of the cell element separation layer 105, a height of the upper surface 146US of the bit line contact is higher than a height of the upper surface of the lower cell insulating layer 135.

A portion of the bit line contact spacer 146SP is disposed between the bit line contact 146 and the cell conductive line 140.

A plurality of storage contacts 120 may be disposed between the cell conductive lines 140 adjacent in the first direction DR1. The storage contact 120 may overlap the substrate 100 and the cell element separation layer 105 between the cell conductive lines 140 adjacent to each other. The storage contact 120 may be connected to the storage connection area 103b (see FIG. 2) of the cell active area ACT. The storage contact 120 may correspond to the buried contact BC.

The plurality of storage contacts 120 may include, for example, at least one of a semiconductor material doped with impurities, a conductive silicide compound, a conductive metal nitride, a metal, and a metal alloy.

The storage pad 160 may be formed on the storage contact 120. The storage pad 160 may be electrically connected to the storage contact 120.

FIGS. 20 to 32 are intermediate step views illustrating a method of fabricating a semiconductor memory device according to some embodiments. For convenience of explanation, a further description of technical aspects and components previously described may be omitted.

Figure 20:
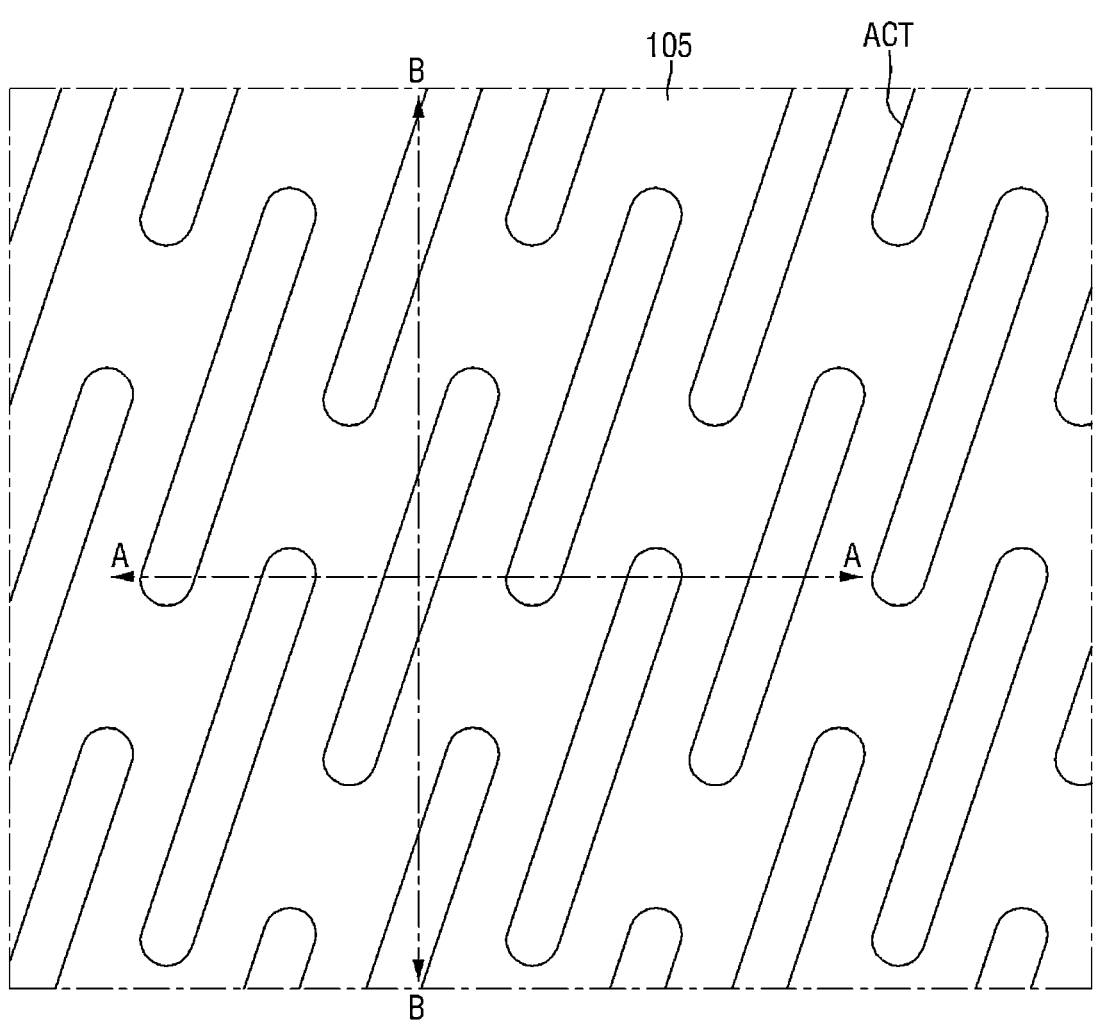
Figure 20:
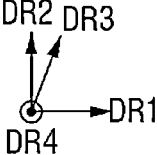
Figure 21:
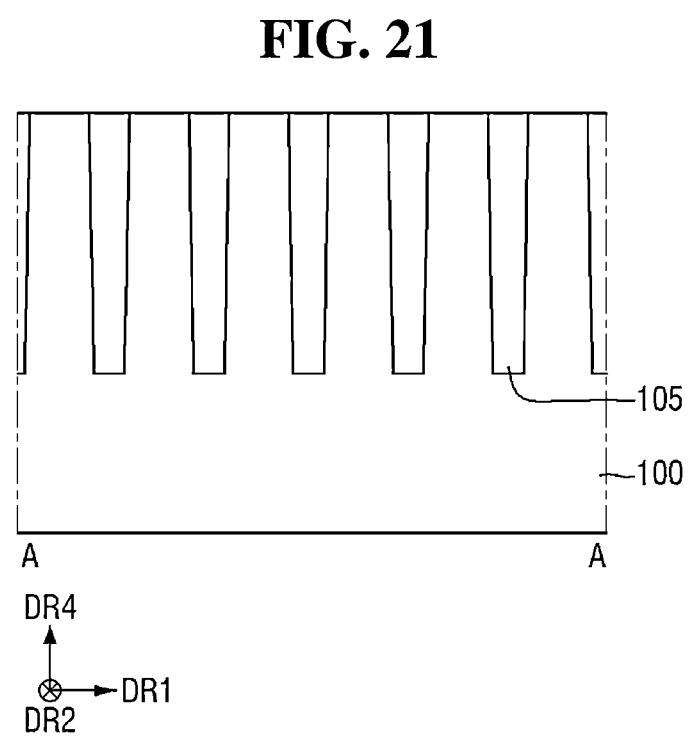
Figure 22:

For reference, FIGS. 21 and 22 are cross-sectional views taken along lines A-A and B-B of FIG. 20, respectively, according to some embodiments.

Referring to FIGS. 20 to 22, a cell element separation layer 105 may be formed in a substrate 100.

The substrate 100 may include a cell active area ACT defined by the cell element separation layer 105. The cell active area ACT may have a bar shape extending in a third direction DR3.

Figure 23:
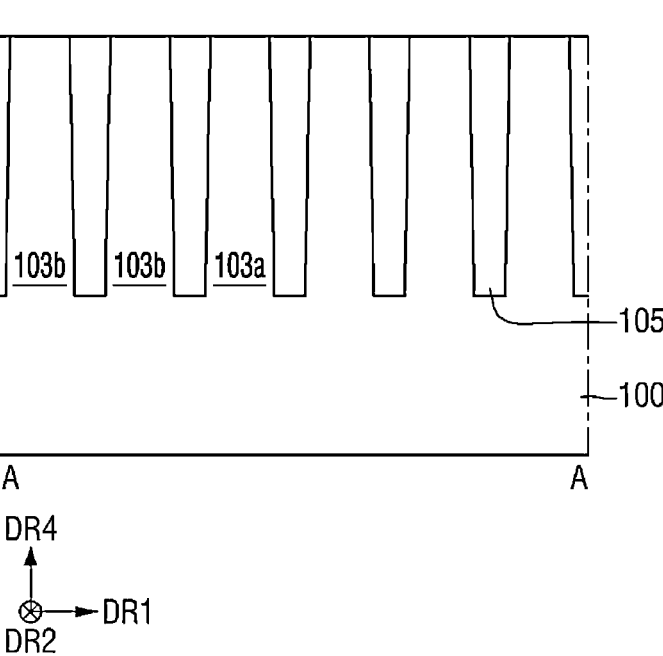
Figure 24:
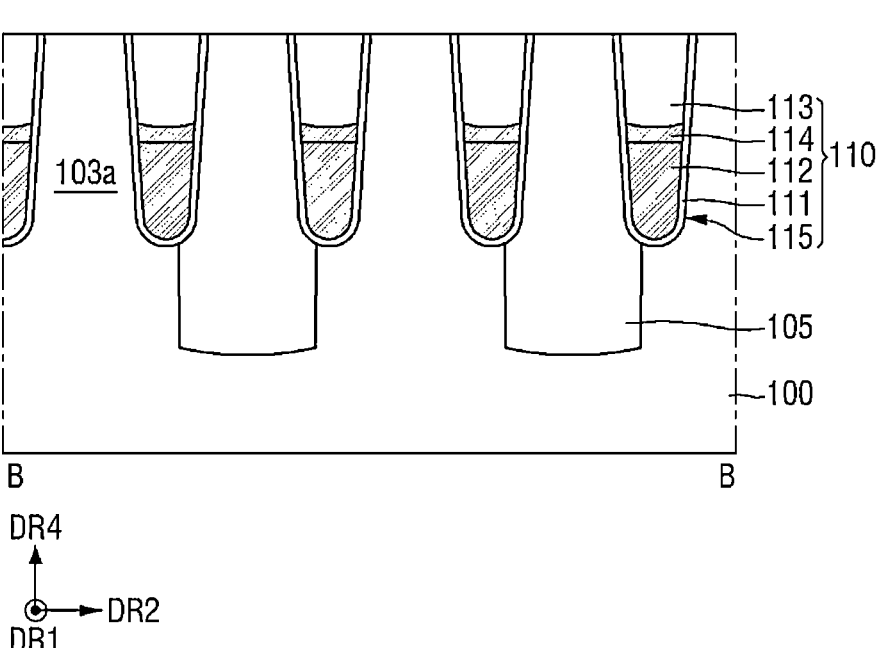

Referring to FIGS. 23 and 24, a cell gate electrode 112 is formed in the substrate 100 and the cell element separation layer 105.

The cell gate electrode 112 may extend to be long in a first direction DR1. That is, in some embodiments, the cell gate electrode 112 may extend lengthwise in the first direction DR1. The cell gate electrodes 112 may be spaced apart from each other in a second direction DR2.

For example, a cell gate structure 110 extending in the first direction DR1 is formed in the substrate 100 and the cell element separation layer 105. The cell gate structure 110 may include a cell gate trench 115, a cell gate insulating layer 111, a cell gate electrode 112, a cell gate capping pattern 113, and a cell gate capping conductive layer 114.

The cell gate electrode 112 intersects the cell active area ACT (see FIG. 20). By the cell gate electrode 112, the cell active area ACT may be divided into a bit line connection area 103a and a storage connection area 103b.

The cell active area ACT includes a bit line connection area 103a positioned at a central portion of the cell active area ACT and a storage connection area 103b positioned at an end portion of the cell active area ACT.

Figure 25:
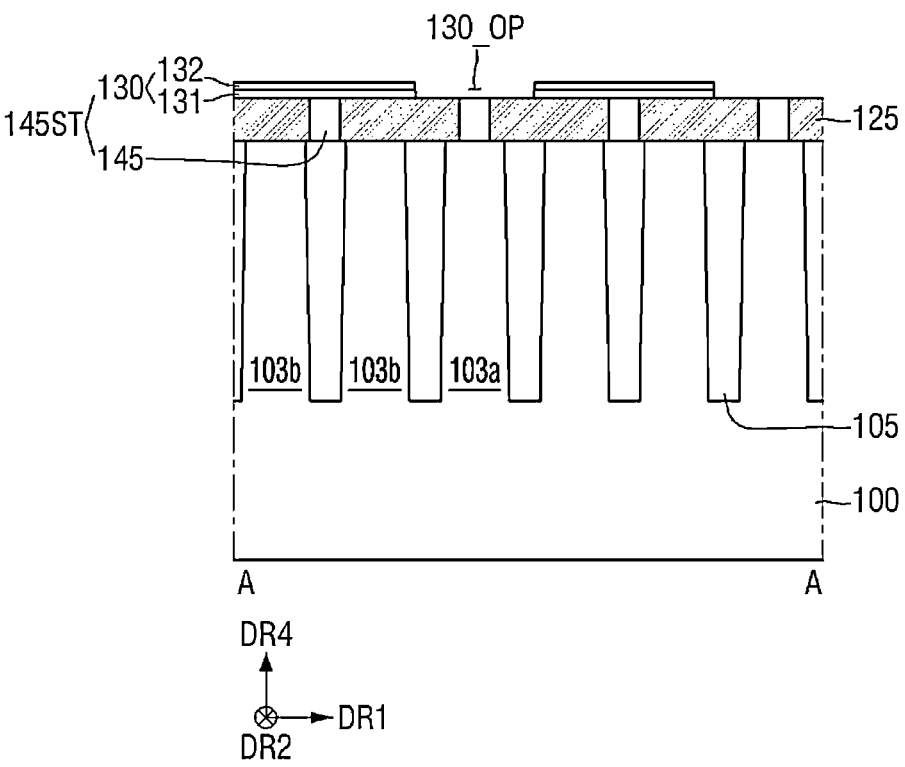
Figure 26:
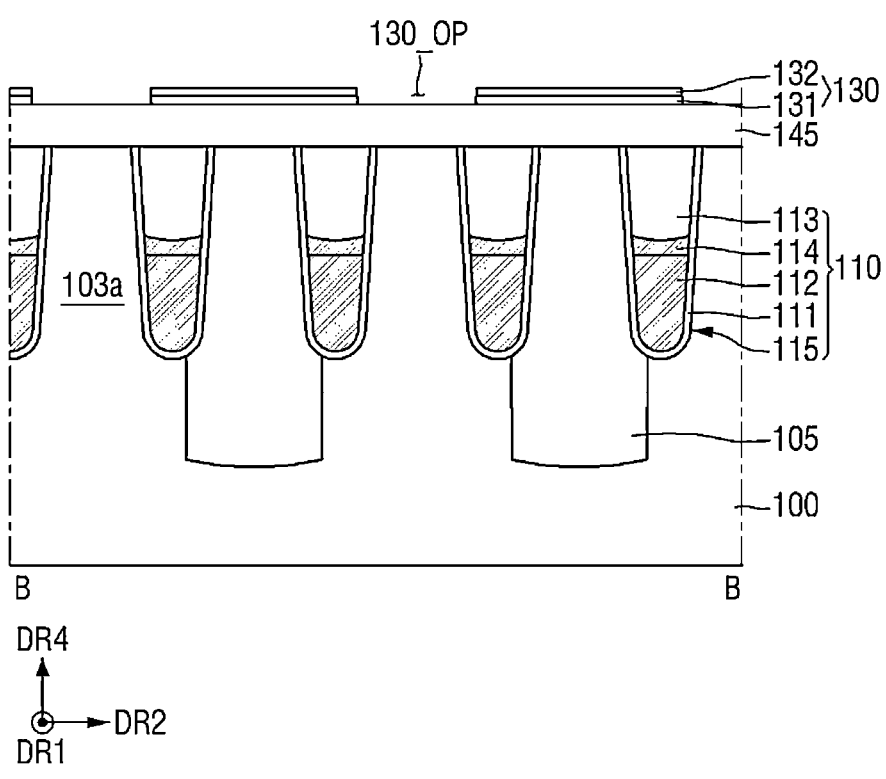

Referring to FIGS. 25 and 26, a node connection pad 125 and a pad separation pattern 145 may be formed on the substrate 100.

The node connection pad 125 is connected to the storage connection area 103b. The node connection pad 125 may be separated by the pad separation pattern 145 extending in the first direction DR1 and the second direction DR2. In a plan view, the pad separation pattern 145 may have a grid shape.

An upper cell insulating layer 130 is formed on the pad separation pattern 145. The upper cell insulating layer 130 includes a bit line contact opening 130_OP. The bit line contact opening 130_OP overlaps the bit line connection area 103a in a fourth direction DR4.

A pad separation structure 145ST including the pad separation pattern 145 and the upper cell insulating layer 130 is formed on the substrate 100.

Figure 27:
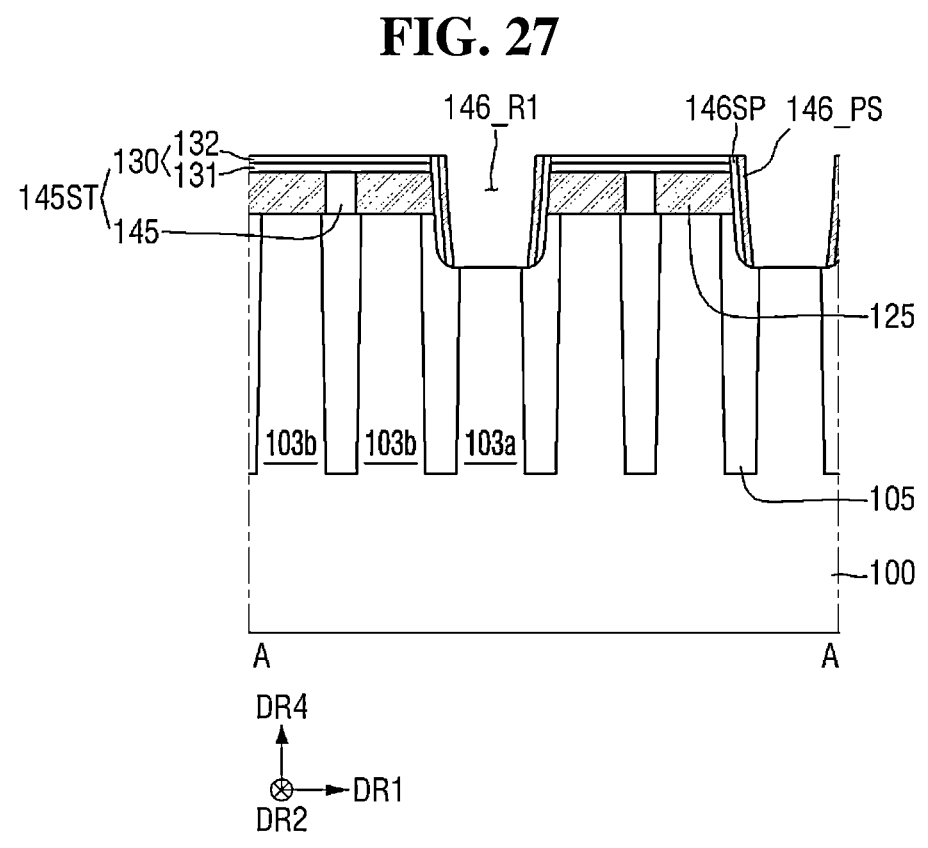
Figure 28:
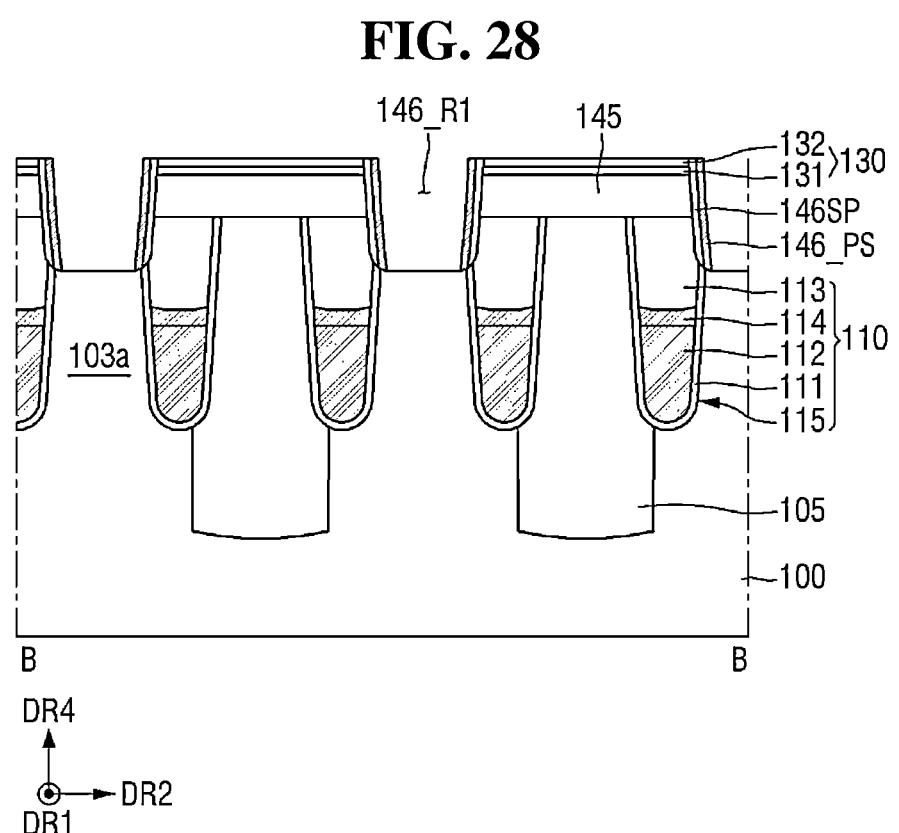

Referring to FIGS. 27 and 28, a first bit line contact recess 146_R1 is formed in the substrate 100 using the upper cell insulating layer 130 as a mask.

The pad separation pattern 145 and the node connection pad 125 exposed through the bit line contact opening 130_OP are etched. Subsequently, the substrate 100, the cell element separation layer 105, and the cell gate capping pattern 113 overlapping the bit line contact opening 130_OP may be removed.

Through this process, the first bit line contact recess 146_R1 is formed in an area corresponding to the bit line contact opening 130_OP.

Subsequently, a bit line contact spacer 146SP is formed along a sidewall of the first bit line contact recess 146_R1. A poly spacer 146_PS is formed on the bit line contact spacer 146SP. The poly spacer 146_PS may include a semiconductor material.

The first bit line contact recess 146_R1 exposes a portion of the substrate 100. The first bit line contact recess 146_R1 exposes the bit line connection area 103a.

Figure 29:
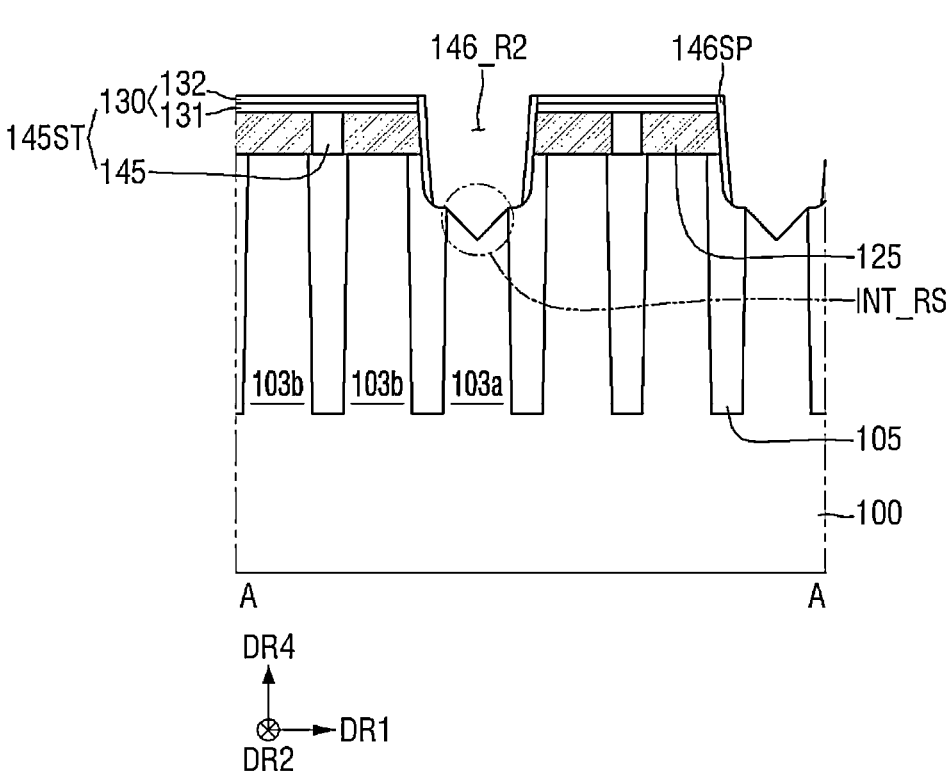
Figure 30:
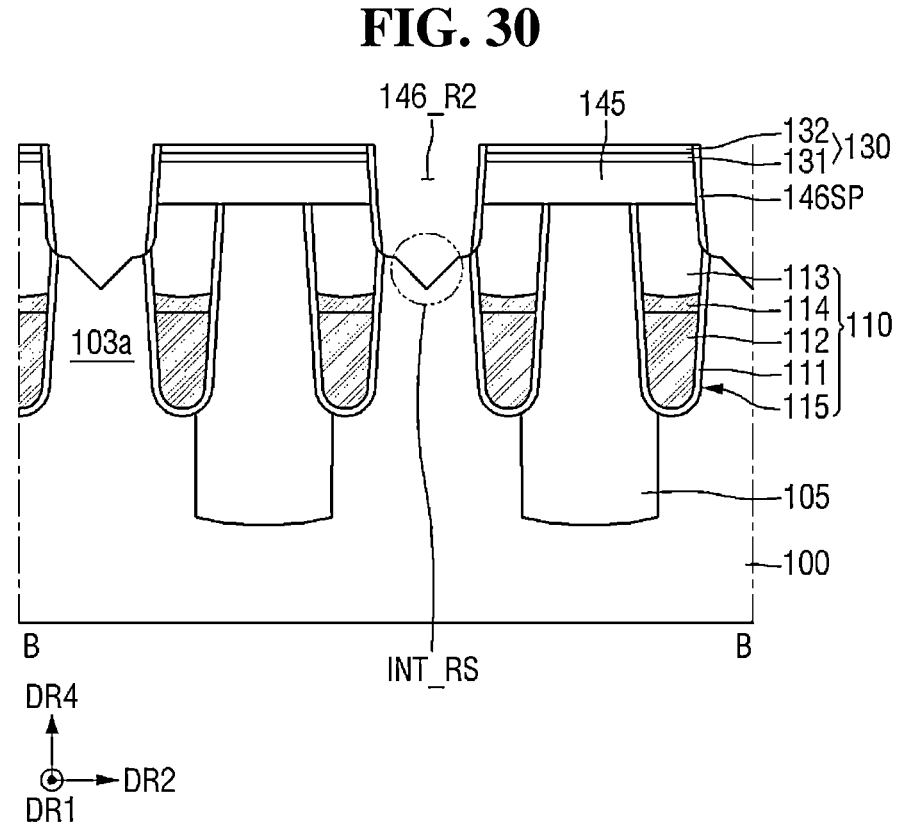

Referring to FIGS. 29 and 30, a portion of the substrate 100 exposed by the first bit line contact recess 146_R1 is etched to form an indent recess INT_RS in the substrate 100.

The indent recess INT_RS may be defined by the inclined boundary surface 100_IF (see FIG. 3) of the substrate illustrated in FIG. 3. A {111} crystal plane group of the substrate 100 may be exposed by the indent recess INT_RS.

A second bit line contact recess 146_R2 includes the indent recess INT_RS. The second bit line contact recess 146_R2 is formed in an area corresponding to the bit line contact opening 130_OP.

While the indent recess INT_RS is formed, the poly spacer 146_PS is removed.

Figure 31:
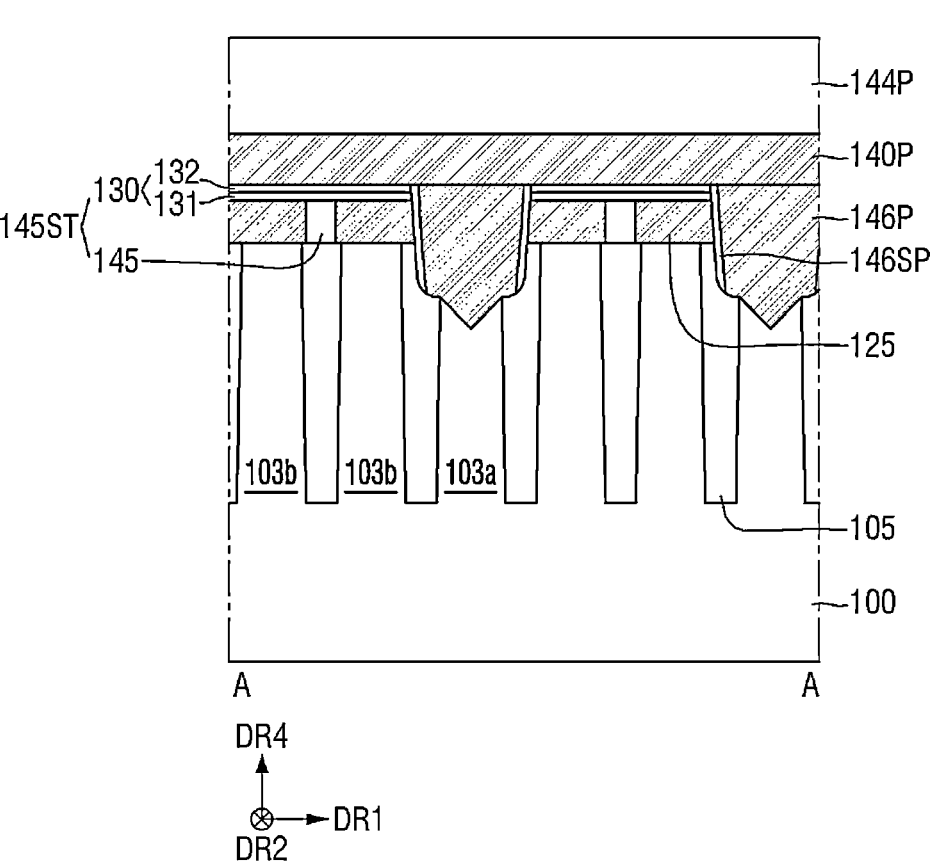
Figure 32:
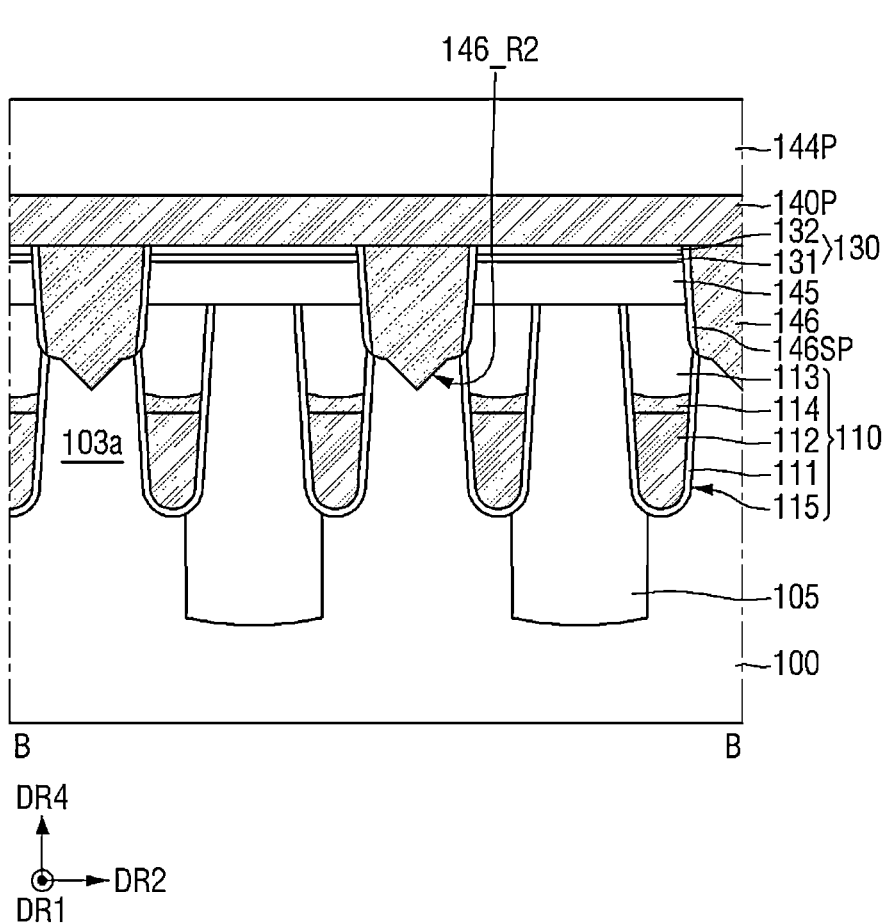

Referring to FIGS. 31 and 32, a pre-bit line contact 146P that fills the second bit line contact recess 146_R2 is formed.

Subsequently, a cell conductive layer 140P and a cell capping layer 144P may be formed on the pre-bit line contact 146P and the upper cell insulating layer 130.

Subsequently, referring to FIGS. 4 and 5, a cell conductive line 140 and a cell line capping layer 144 are formed by patterning the cell capping layer 144P and the cell conductive layer 140P. That is, a bit line structure 140ST extending to be long in the second direction DR2 (e.g., a bit line structure 140ST extending lengthwise in the second direction DR2) is formed.

In addition, the pre-bit line contact 146P may be patterned to form the bit line contact 146.

Subsequently, a bit line spacer 150 and a storage pad 160 may be formed. In addition, an information storage portion 190 connected to the storage pad 160 may be formed on the storage pad 160.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A semiconductor memory device, comprising:

a substrate comprising an active area defined by an element separation layer, wherein the active area comprises a first portion and second portions defined on both sides of the first portion;

a bit line crossing the active area and extending in a first direction on the substrate; and a bit line contact disposed between the substrate and the bit line and directly connected to the first portion of the active area, wherein the bit line contact comprises an indent area recessed into the substrate and an upper area on the indent area, a width of the indent area of the bit line contact decreases as a distance from the bit line increases, the indent area of the bit line contact comprises a slope forming a boundary with the substrate and having a substantially straight line shape, a starting point of the slope of the indent area is lower than an upper surface of the element separation layer, and wherein the upper area of the bit line contact comprises a portion having a width that increases in a second direction different from the first direction as the distance from the bit line increases.

2. The semiconductor memory device of claim 1, further comprising:

a bit line spacer disposed on a sidewall of the bit line and a sidewall of the upper area of the bit line contact, wherein the indent area of the bit line contact is disposed on a lower side of the bit line spacer.

3. The semiconductor memory device of claim 1, further comprising:

an impurity pile-up area in which impurities are piled up along the slope of the indent area.

4. The semiconductor memory device of claim 3, wherein the impurities comprise at least one of carbon, nitrogen, a halogen element, and phosphorus.

5. The semiconductor memory device of claim 1, further comprising:

node connection pads disposed on the substrate and connected to the second portions of the active area, wherein an upper surface of the node connection pads is lower than a bottom surface of the bit line.

6. The semiconductor memory device of claim 5, further comprising:

a pad separation pattern disposed on the substrate and covering the upper surface of the node connection pads.

7. The semiconductor memory device of claim 6, wherein an upper surface of the pad separation pattern is on a same plane as the bottom surface of the bit line.

8. The semiconductor memory device of claim 1, further comprising:

information storage portions connected to the second portions of the active area, wherein the information storage portions comprises a lower electrode, a capacitor dielectric layer disposed on the lower electrode, and an upper electrode disposed on the capacitor dielectric layer.

9. A semiconductor memory device, comprising:

a substrate comprising an active area defined by an element separation layer;

a word line crossing the active area in a first direction, wherein the word line is one of a plurality of word lines;

a bit line crossing the active area and extending in a second direction different from the first direction on the substrate; and a bit line contact disposed between word lines among the plurality of word lines adjacent in the second direction and directly connected to the bit line and the active area, wherein the bit line contact comprises an indent area recessed into the substrate and an upper area on the indent area, a width of the indent area of the bit line contact decreases as a distance from the bit line increases, the indent area of the bit line contact comprises a slope forming a boundary with the substrate and having a substantially straight line shape, and a starting point of the slope of the indent area is lower than an upper surface of the element separation layer, wherein the upper area of the bit line contact comprises a portion having a width that increases in the second direction as a distance from the bit line increases.

10. The semiconductor memory device of claim 9, wherein a width of the bit line contact in contact with the substrate in the second direction is a first width, and a width of the indent area of the bit line contact in the second direction is a second width smaller than the first width.

11. The semiconductor memory device of claim 9, wherein a width of the bit line contact in contact with the substrate in the second direction is about equal to a width of the indent area of the bit line contact in the second direction.

12. The semiconductor memory device of claim 9, wherein the indent area of the bit line contact comprises a bottom surface connected to the slope, and the bottom surface of the indent area has a substantially straight line shape.

13. The semiconductor memory device of claim 9, further comprising:

an impurity pile-up area in which impurities are piled up along the slope of the indent area.

14. The semiconductor memory device of claim 9, further comprising:

a cell gate capping pattern disposed on the word line and extending in the first direction along the word line, wherein the slope of the indent area does not comprise a portion extending along the cell gate capping pattern.

15. The semiconductor memory device of claim 9, further comprising:

a plurality of bit line contact spacers disposed along sidewalls of the upper area of the bit line contact and spaced apart from each other in the second direction.

* * * * *